(12) United States Patent
Srirattana et al.

(10) Patent No.: US 12,719,419 B2
(45) Date of Patent: Aug. 25, 2026

(54) BIAS CIRCUIT FOR INDEPENDENT CONTROL OF ON AND OFF SWITCHING TIME

(71) Applicant: Skyworks Solutions, Inc., Irvine, CA (US)

(72) Inventors: Nuttapong Srirattana, Lexington, MA (US); Zijiang Yang, Lexington, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 400 days.

(21) Appl. No.: 18/415,617

(22) Filed: Jan. 17, 2024

(65) Prior Publication Data

US 2024/0243705 A1 Jul. 18, 2024

Related U.S. Application Data

(60) Provisional application No. 63/480,480, filed on Jan. 18, 2023.

(51) Int. Cl.
*H03F 3/19* (2006.01)

(52) U.S. Cl.
CPC ......... *H03F 3/19* (2013.01); *H03F 2200/451* (2013.01)

(58) Field of Classification Search
CPC ............................. H03F 3/19; H03F 2200/451
See application file for complete search history.

(56) References Cited

U.S. PATENT DOCUMENTS 5,774,017 A 6/1998 Adar
6,351,628 B1 * 2/2002 Leizerovich ........... H04B 1/406 455/552.1
6,437,647 B1 8/2002 Flowler
6,496,073 B2 12/2002 Choi
6,529,716 B1 3/2003 Eidson et al.
6,753,734 B2 6/2004 Arell et al.
6,882,227 B2 4/2005 Barry et al.
6,937,101 B2 8/2005 Hageman et al.
7,482,868 B2 1/2009 Hageman et al.
7,493,097 B2 2/2009 Ismail et al.
7,729,674 B2 6/2010 Shie et al.
7,876,157 B1 1/2011 Kang et al.
8,008,970 B1 8/2011 Homol et al.
8,301,084 B2 10/2012 Gorbachov
8,362,840 B2 1/2013 Andrys et al.
8,368,463 B2 2/2013 Homol et al.
8,369,805 B2 2/2013 Homol et al.

(Continued)

*Primary Examiner* — Junpeng Chen
(74) *Attorney, Agent, or Firm* — VIA LLP

(57) ABSTRACT

An amplifier system for radio frequency hot switching of a power amplifier can include a field-effect transistor, a forward biasing network, and a reverse biasing network. The forward biasing network is configured to provide a positive bias voltage to a gate terminal of the field-effect transistor, and the reverse biasing network is configured to provide a negative bias voltage to the gate terminal, with resistance of both biasing networks selected to independently control an on and off-switching time of the field-effect transistor. The independent on and off-switching time can allow for rapid "hot switching" in a connected power amplifier while the power amplifier is energized, while reducing spurious emissions of radio frequency signals by the power amplifier.

20 Claims, 19 Drawing Sheets

(56) References Cited

U.S. PATENT DOCUMENTS 8,525,590 B2 9/2013 Joly et al.
8,880,014 B2 11/2014 Homol et al.
8,923,782 B1 * 12/2014 Ravindran ............... H04B 1/44 327/434
9,407,215 B2 8/2016 Gill
9,413,313 B2 8/2016 Banowetz et al.
9,473,076 B2 10/2016 Ni et al.
9,543,941 B2 1/2017 Cebi et al.
9,577,626 B2 2/2017 Crandall et al.
9,595,951 B2 3/2017 Sprinkle et al.
9,774,307 B2 9/2017 Banowetz et al.
9,787,305 B2 10/2017 Liu et al.
9,831,841 B2 11/2017 Wu et al.
9,917,549 B1 3/2018 Allen
9,954,430 B2 4/2018 Horváth et al.
10,103,726 B2 10/2018 Wilz et al.
10,110,168 B2 10/2018 Soliman
10,187,023 B2 1/2019 Andrys et al.
10,284,160 B2 5/2019 Lee
10,312,864 B2 6/2019 Joly et al.
10,389,305 B2 8/2019 Lee et al.
10,389,350 B2 8/2019 Wang et al.
10,419,057 B2 9/2019 Musiol et al.
10,469,045 B2 11/2019 Lee
10,469,072 B2 11/2019 Wang et al.
10,498,329 B2 12/2019 Wang et al.
10,547,303 B2 1/2020 Wang et al.
10,547,305 B2 1/2020 Wilz et al.
10,574,227 B2 2/2020 Wang et al.
10,630,282 B2 4/2020 Wang et al.
10,630,283 B2 4/2020 Wang et al.
10,666,200 B2 5/2020 Gebeyehu et al.
10,693,459 B2 6/2020 Blin
10,763,847 B2 9/2020 Wang et al.
10,862,475 B2 12/2020 Wang et al.
11,063,586 B2 7/2021 Wang et al.
11,177,802 B2 11/2021 Yang et al.
11,196,453 B2 12/2021 Moreschi
11,329,609 B2 5/2022 Johnson et al.
11,380,968 B2 7/2022 Puente et al.
11,394,384 B2 7/2022 Blin et al.
11,418,185 B2 8/2022 Wang et al.
11,502,678 B2 11/2022 Yang et al.
11,996,832 B2 5/2024 Wang et al.
2004/0251952 A1 * 12/2004 Nakatsuka ........... H03K 17/102 327/430
2011/0092179 A1 * 4/2011 Burgener ................. H04B 1/40 455/333
2015/0171860 A1 6/2015 Blin
2015/0256172 A1 * 9/2015 Campbell ............ H03K 17/161 307/139
2016/0085256 A1 * 3/2016 Cam ....................... G05F 3/247 327/382
2017/0272066 A1 * 9/2017 Scott .................... H03K 17/161
2018/0175814 A1 6/2018 Wu
2021/0028800 A1 * 1/2021 Balteanu .............. H04B 1/0078
2021/0203322 A1 7/2021 Blin
2022/0149832 A1 5/2022 Yang et al.
2022/0321074 A1 10/2022 Lehtola
2022/0337233 A1 * 10/2022 Kaymaksut .......... H03K 17/693
2022/0352888 A1 11/2022 Blin
2023/0012894 A1 1/2023 Liang et al.
2023/0014555 A1 1/2023 Liang et al.
2023/0095390 A1 3/2023 Lehtola
2023/0097146 A1 3/2023 Lehtola
2023/0216457 A1 7/2023 Liu et al.
2023/0246644 A1 8/2023 Lam
2024/0014788 A1 1/2024 Jia et al.
2024/0243705 A1 7/2024 Srirattana et al.

* cited by examiner 1040
1003
1004a
1051a
1004b
1051b
506a
500a
506b
SWITCH CONTROL 1050a
505a
SWITCH CONTROL 1050b
505b
1044
500b
1047
PA BIAS
PA
1023
RF SIGNAL
1002
I/Q MODULATOR
1057
1058
1059
ADC
I
Q
BASEBAND
1001

BIAS CIRCUIT FOR INDEPENDENT CONTROL OF ON AND OFF SWITCHING TIME

INCORPORATION BY REFERENCE TO ANY PRIORITY APPLICATIONS

Any and all application for which a foreign or domestic priority claim identified in the Application Data Sheet as filed with the present application are hereby incorporated by reference under 37 CFR 1.57.

BACKGROUND

Field

Aspects of this disclosure relate to electronic systems, and in particular, to radio frequency electronics.

Description of the Related Art

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about 400 MHz to about 7.125 GHz for Fifth Generation (5G) cellular communications in Frequency Range 1 (FR1) or in the range of about 24.250 GHz to about 71.000 GHz for Frequency Range 2 (FR2) of the 5G communication standard.

Examples of RF communication systems include, but are not limited to, mobile phones, tablets, base stations, network access points, customer-premises equipment (CPE), laptops, and wearable electronics.

SUMMARY

RF communication systems typically include an RF front-end which couples transmit and receive paths between a transceiver (which is coupled to a baseband processor) and one or more antennas. Such RF front-ends may include power amplifier(s), low noise amplifier(s), and/or filter(s) to process RF signals transmitted to and received from the antennas. Typically, these amplifiers are provided a bias voltage supplied from one or more bias circuits. The bias circuits are configured for rapid on-off switching to be operable at RF frequencies.

In some aspects, the techniques described herein relate to a power amplifier system including: a power amplifier configured to output an amplified radio frequency signal; a switch including a control input terminal, a radio frequency signal input terminal configured to receive to the amplified radio frequency signal, and a radio frequency signal output terminal, the switch configured to switch on and off in response to a control signal provided on the control input terminal, and to pass the amplified radio frequency signal from the radio frequency signal input terminal to the radio frequency signal output terminal when the switch is switched on; and a switch control circuit including a control input configured to receive a switch control signal, a control output connected to the control input terminal of the switch, a forward biasing network including a first resistor and a first diode connected in series between the control input and the control output, and a reverse biasing network including a second resistor and a second diode connected in series between the control input and the control output, an on-switching time of the switch depending on a resistance of the first resistor, and an off-switching time of the switch depending on a resistance of the second resistor.

In some aspects, the techniques described herein relate to a power amplifier system further including a network of one or more resistors between the radio frequency signal input terminal and the radio frequency signal output terminal of the switch.

In some aspects, the techniques described herein relate to a power amplifier system wherein the switch includes a field-effect transistor, and the control input terminal, radio frequency signal input terminal, and radio frequency signal output terminal correspond to a gate, source, and drain of the field-effect transistor, respectively.

In some aspects, the techniques described herein relate to a power amplifier system wherein the field-effect transistor is a metal-oxide semiconductor field-effect transistor (MOSFET) or a metal-semiconductor field-effect transistor (MESFET).

In some aspects, the techniques described herein relate to a power amplifier system wherein the forward biasing network or the reverse biasing network includes at least one additional circuit element configured in parallel with the first resistor or the second resistor.

In some aspects, the techniques described herein relate to a power amplifier system wherein the at least one additional circuit element is a capacitor configured to charge the forward biasing network or the reverse biasing network based upon a polarity of the switch control signal.

In some aspects, the techniques described herein relate to a power amplifier system wherein the resistance of the second resistor is higher than the resistance of the first resistor such that the on-switching time of the power amplifier system is lower than the off-switching time of the power amplifier system.

In some aspects, the techniques described herein relate to a power amplifier system wherein the resistance of the second resistor is at least 50% higher than the resistance of the first resistor.

In some aspects, the techniques described herein relate to a power amplifier system wherein the resistance of the second resistor is at least 75% higher than the resistance of the first resistor.

In some aspects, the techniques described herein relate to a power amplifier system wherein the resistance of the second resistor is at least double the resistance of the first resistor.

In some aspects, the techniques described herein relate to a power amplifier system wherein the first resistor is an 80 kΩ resistor and the second resistor is a 200 kΩ resistor.

In some aspects, the techniques described herein relate to a power amplifier system wherein spurious emissions from the power amplifier system at a 30 MHz offset from a radio frequency input signal frequency are attenuated by at least 70 dBm.

In some aspects, the techniques described herein relate to a power amplifier system wherein spurious emissions from the power amplifier system at a 60 MHz offset from a radio frequency input signal frequency are attenuated by at least 110 dBm.

In some aspects, the techniques described herein relate to a power amplifier system wherein spurious emissions from the power amplifier system at a 30 MHz offset from a radio frequency input signal frequency are attenuated by at least 80 dBm.

In some aspects, the techniques described herein relate to a radio frequency switching circuit including: a switch including a control input terminal, a radio frequency signal input terminal configured to receive an amplified radio frequency signal, and a radio frequency signal output terminal, the switch configured to switch on and off in response to a control signal provided on the control input terminal, and to pass the amplified radio frequency signal from the radio frequency signal input terminal to the radio frequency signal output terminal when the switch is switched on; and a switch control circuit including a control input configured to receive a switch control signal, a control output connected to the control input terminal of the switch, a forward biasing network including a first resistor and a first diode connected in series between the control input and the control output, and a reverse biasing network including a second resistor and a second diode connected in series between the control input and the control output, an on-switching time of the switch depending on a resistance of the first resistor, and an off-switching time of the switch depending on a resistance of the second resistor.

In some aspects, the techniques described herein relate to a radio frequency switching circuit further including a network of one or more resistors between the radio frequency signal input terminal and the radio frequency signal output terminal of the switch.

In some aspects, the techniques described herein relate to a radio frequency switching circuit wherein the switch includes a field-effect transistor, and the control input terminal, radio frequency signal input terminal, and radio frequency signal output terminal correspond to a gate, source, and drain of the field-effect transistor, respectively.

In some aspects, the techniques described herein relate to a radio frequency switching circuit wherein the field-effect transistor is a metal-oxide semiconductor field-effect transistor (MOSFET) or a metal-semiconductor field-effect transistor (MESFET).

In some aspects, the techniques described herein relate to a radio frequency switching circuit wherein the forward biasing network or the reverse biasing network includes at least one additional circuit element configured in parallel with the first resistor or the second resistor.

In some aspects, the techniques described herein relate to a radio frequency switching circuit wherein the at least one additional circuit element is a capacitor configured to charge the forward biasing network or the reverse biasing network based upon a polarity of the switch control signal.

In some aspects, the techniques described herein relate to a radio frequency switching circuit wherein the resistance of the second resistor is higher than the resistance of the first resistor such that an on-switching time is lower than an off-switching time.

In some aspects, the techniques described herein relate to a radio frequency switching circuit wherein the resistance of the second resistor is at least 50% higher than the resistance of the first resistor.

In some aspects, the techniques described herein relate to a radio frequency switching circuit wherein the resistance of the second resistor is at least 75% higher than the resistance of the first resistor.

In some aspects, the techniques described herein relate to a radio frequency switching circuit wherein the resistance of the second resistor is at least double the resistance of the first resistor.

In some aspects, the techniques described herein relate to a radio frequency switching circuit wherein the first resistor is an 80 kΩ resistor and the second resistor is a 200 kΩ resistor.

In some aspects, the techniques described herein relate to a mobile device including: a transceiver configured to generate a radio frequency signal; the power amplifier system and configured to receive the radio frequency signal; and an antenna configured to transmit an amplified radio frequency signal provided by the power amplifier system.

DETAILED DESCRIPTION OF THE PREFERRED EMBODIMENT

Figure 1:
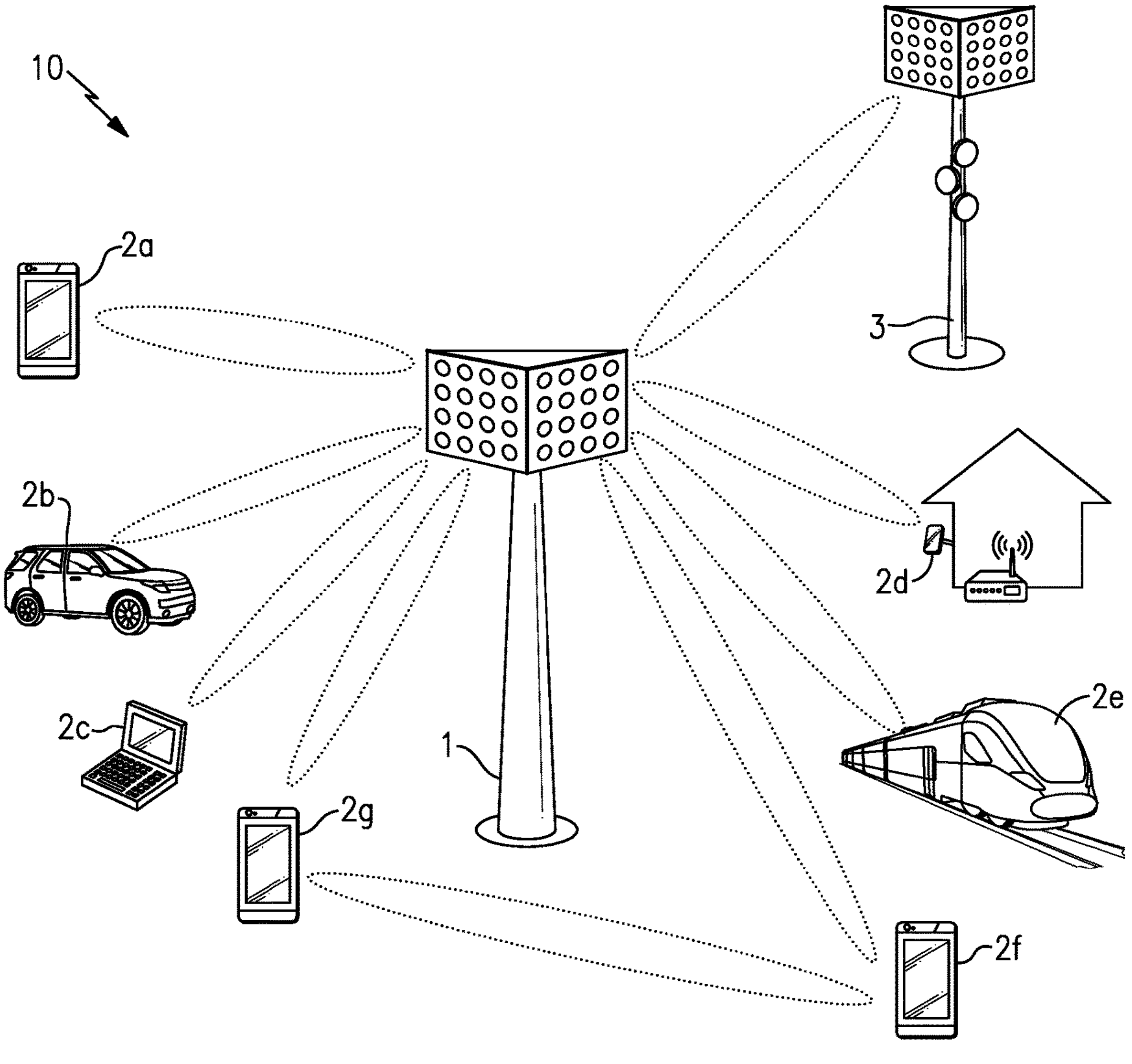
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2*a*, a wireless-connected car 2*b*, a laptop 2*c*, a stationary wireless device 2*d*, a wireless-connected train 2*e*, a second mobile device 2*f*, and a third mobile device 2*g*.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2*g* and mobile device 2*f*).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

In certain implementations, the communication network 10 supports supplementary uplink (SUL) and/or supplementary downlink (SDL). For example, when channel conditions are good, the communication network 10 can direct a particular UE to transmit using an original uplink frequency, while when channel condition is poor (for instance, below a certain criteria) the communication network 10 can direct the UE to transmit using a supplementary uplink frequency that is lower than the original uplink frequency. Since cell coverage increases with lower frequency, communication range and/or signal-to-noise ratio (SNR) can be increased using SUL. Likewise, SDL can be used to transmit using an original downlink frequency when channel conditions are good, and to transmit using a supplementary downlink frequency when channel conditions are poor.

Figure 2A:
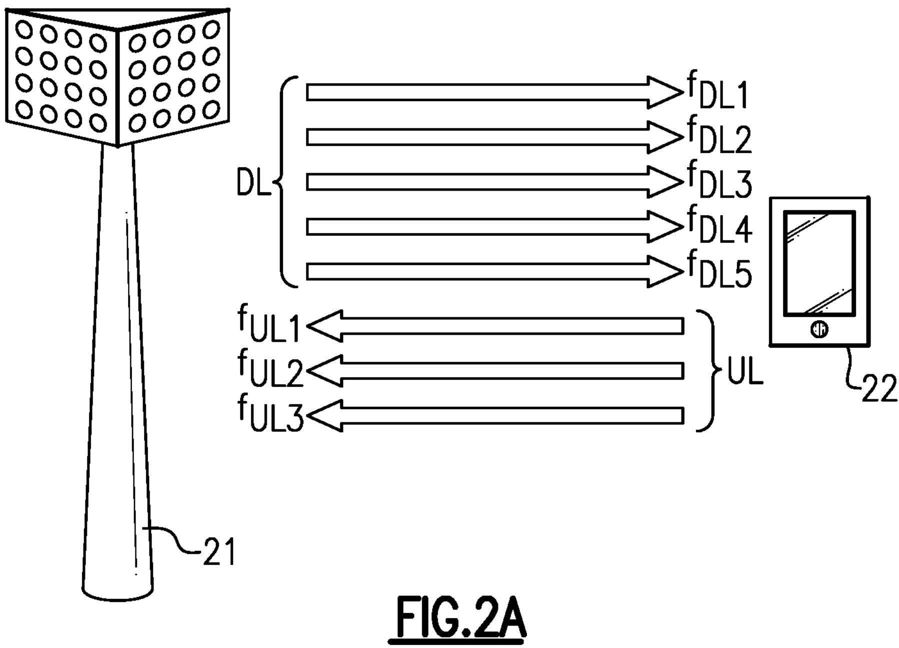
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
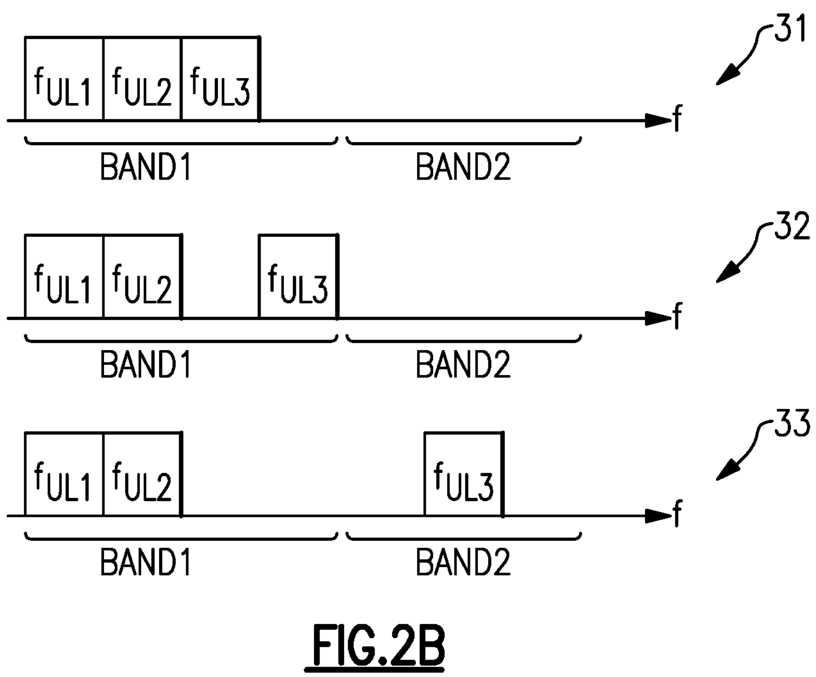
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
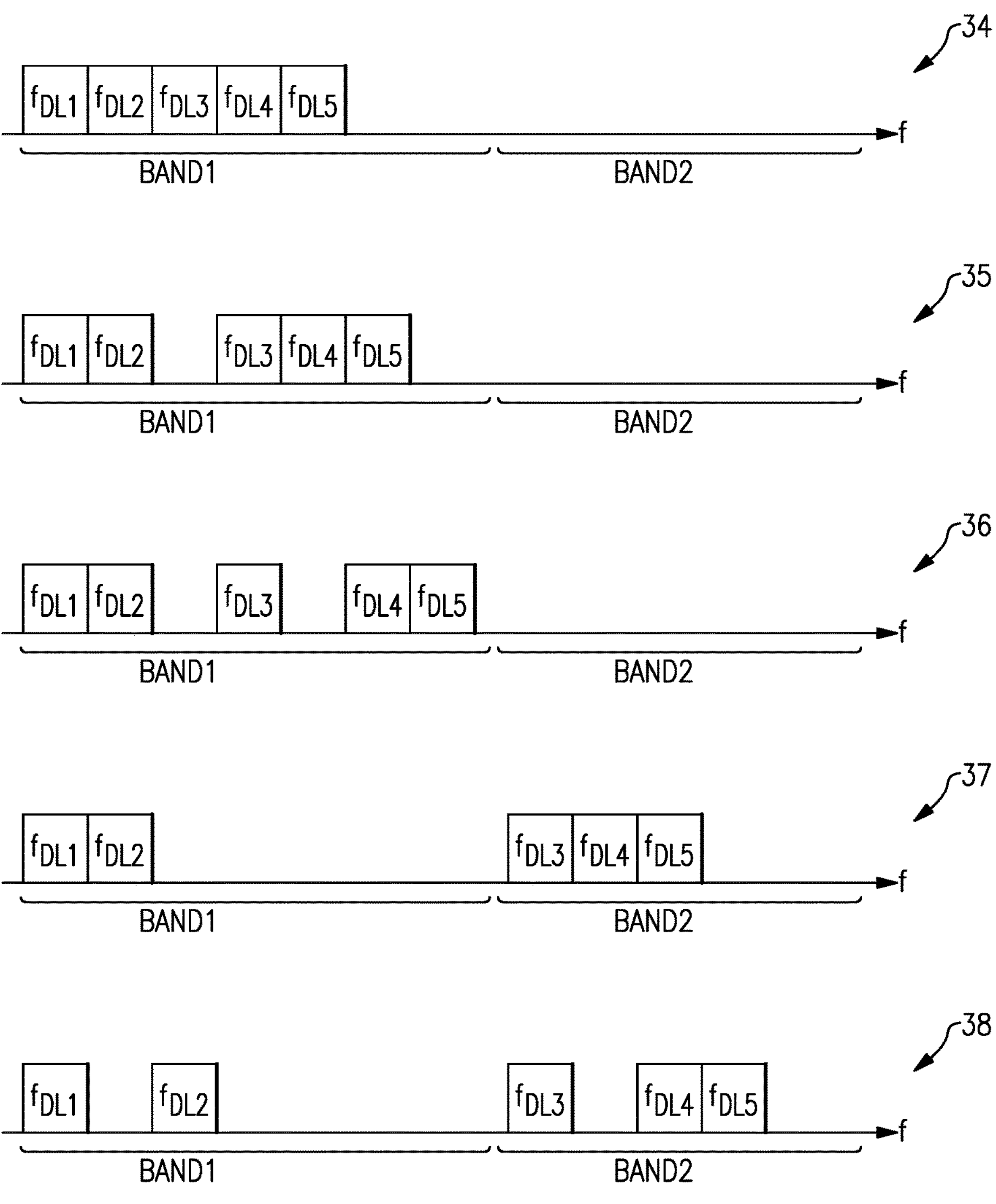
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Figure 3A:
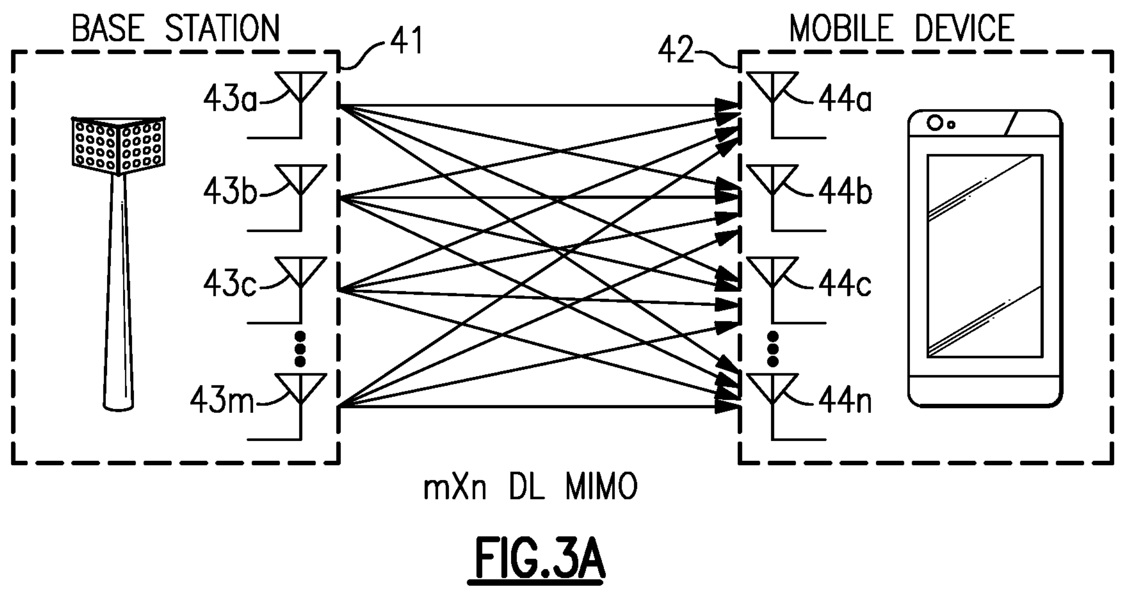
FIG. 3A is a schematic diagram of one example of a downlink channel using multi-input and multi-output (MIMO) communications.
Figure 3B:
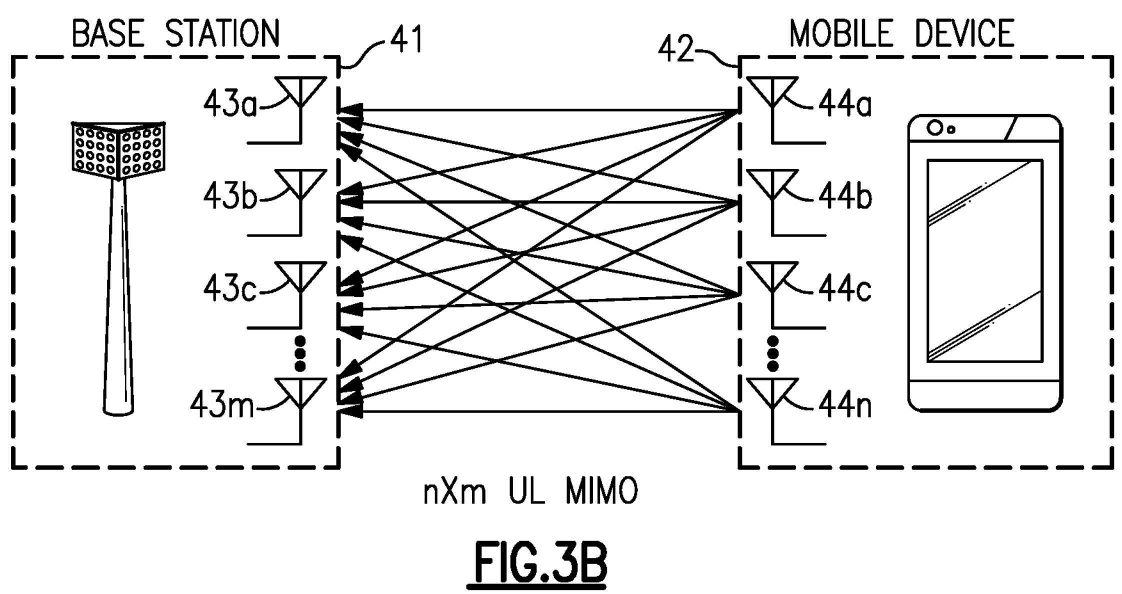
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43*a*, 43*b*, 43*c*, . . . 43*m* of the base station 41 and receiving using N antennas 44*a*, 44*b*, 44*c*, . . . 44*n* of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44*a*, 44*b*, 44*c*, . . . 44*n* of the mobile device 42 and receiving using M antennas 43*a*, 43*b*, 43*c*, . . . 43*m* of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
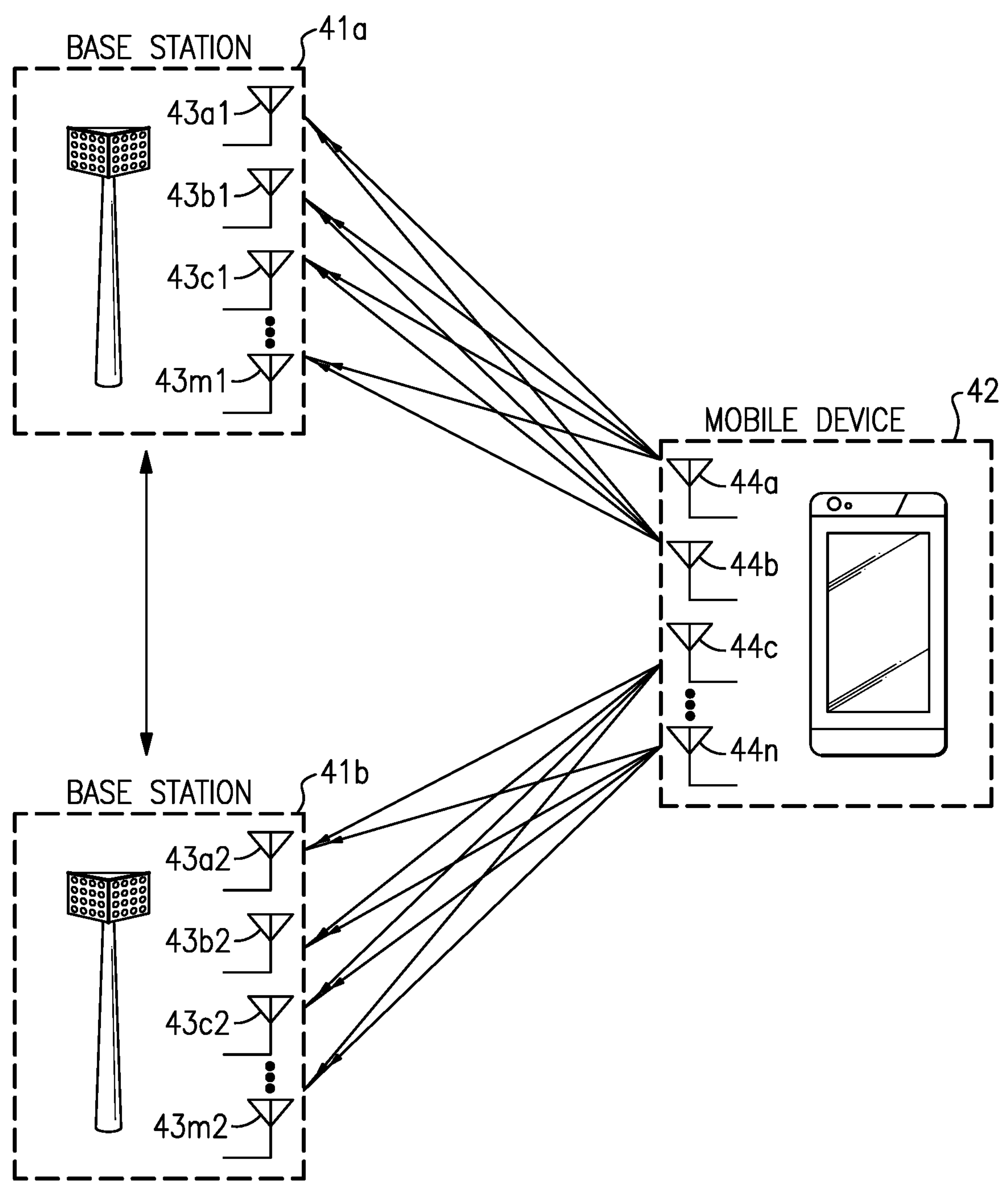
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44*a*, 44*b*, 44*c*, . . . 44*n* of the mobile device 42. Additional a first portion of the uplink transmissions are received using M antennas 43*a*1, 43*b*1, 43*c*1, . . . 43*m*1 of a first base station 41*a*, while a second portion of the uplink transmissions are received using M antennas 43*a*2, 43*b*2, 43*c*2, . . . 43*m*2 of a second base station 41*b*. Additionally, the first base station 41*a* and the second base station 41*b* communication with one another over wired, optical, and/or wireless links.

The MIMO scenario of FIG. 3C illustrates an example in which multiple base stations cooperate to facilitate MIMO communications.

With the introduction of the 5G NR air interface standards, 3GPP has allowed for the simultaneous operation of 5G and 4G standards in order to facilitate the transition. This mode can be referred to as Non-Stand-Alone (NSA) operation or E-UTRAN New Radio-Dual Connectivity (EN-DC) and involves both 4G and 5G carriers being simultaneously transmitted from a user equipment (UE).

In certain EN-DC applications, dual connectivity NSA involves overlaying 5G systems onto an existing 4G core network. For dual connectivity in such applications, the control and synchronization between the base station and the UE can be performed by the 4G network while the 5G network is a complementary radio access network tethered to the 4G anchor. The 4G anchor can connect to the existing 4G network with the overlay of 5G data/control.

Figure 4A:
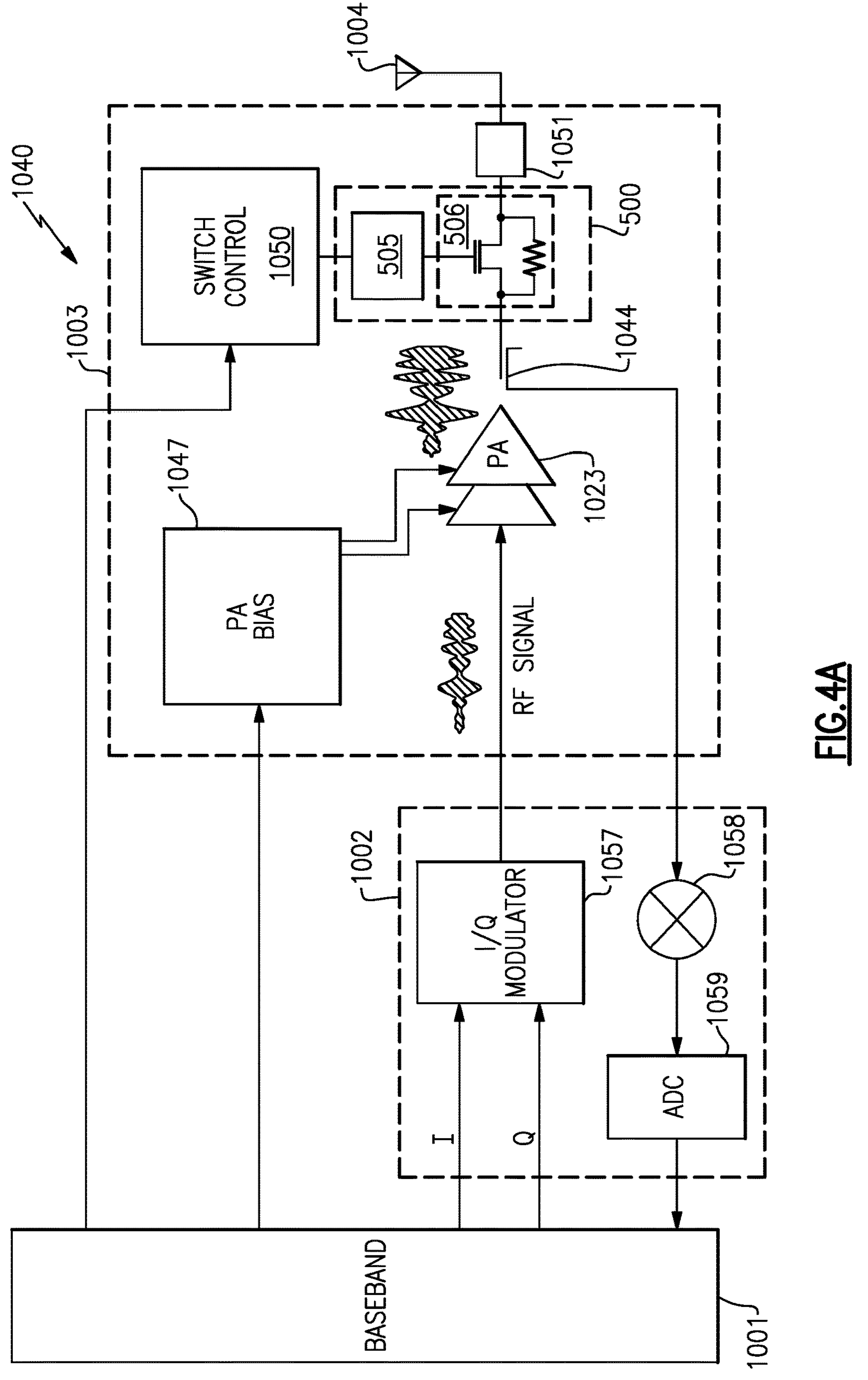
FIG. 4A is a schematic diagram of a power amplifier system including a power amplifier switching circuit for independent control of on and off switching time, according to one embodiment.

Power Amplifier System with Bias Circuit for Independent Control of on and Off Switching Time FIG. 4A is a schematic diagram of a power amplifier system 1040 according to one embodiment. The illustrated power amplifier system 1040 includes a baseband processor 1001, a transmitter/observation receiver 1002, one or more antennas 1004, and an RF front-end 1003 including a power amplifier (PA) 1023, a directional coupler 1044, a PA bias control circuit 1047, a switch control circuit 1050, an RF amplifier switching circuit 500, and additional front-end circuitry 1051.

The RF amplifier switching circuit 500 can include an RF switch bias circuit 505 and an RF switch 506. Certain embodiments of the RF amplifier switching circuit 500 will be described in further detail herein, e.g., with respect FIG. 5A-11B.

The illustrated transmitter/observation receiver 1002 includes an I/Q modulator 1057, a mixer 1058, and an analog to digital converter (ADC) 1059. Although not illustrated in FIG. 4A for simplicity, in certain implementations, the transmitter/observation receiver 1002 is incorporated into a transceiver. For example, such a transceiver can include a receiver including filters, low noise amplifier(s), additional mixers, ADCs, etc.

The baseband processor 1001 can be used to generate an in-phase (I) signal and a quadrature-phase (Q) signal, which can be used to represent a sinusoidal wave or signal of a desired amplitude, frequency, and phase. For example, the I signal can be used to represent an in¬ phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 1057 in a digital format. The baseband processor 1001 can be any suitable processor configured to process a baseband signal. For instance, the baseband processor 1001 can include a digital signal processor, a microprocessor, a programmable core, or any combination thereof. Moreover, in some implementations, two or more baseband processors 1001 can be included in the power amplifier system 1040.

The I/Q modulator 1057 can be configured to receive the I and Q signals from the baseband processor 1001 and to process the I and Q signals to generate an RF signal. For example, the I/Q modulator 1057 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 1011. In certain implementations, the I/Q modulator 1057 can include one or more filters configured to filter frequency content of signals processed therein.

The power amplifier 1023 can receive the RF signal from the I/Q modulator 1057, and when enabled can provide an amplified RF signal to the antenna 1004 via the additional front-end circuitry 1051.

The additional front-end circuitry 1051 can be implemented in a wide variety of ways. In one example, the additional front-end circuitry 1051 includes one or more switches, filters, duplexers, multiplexers, and/or other components. In another example, some or all of the additional front-end circuitry 1003 is omitted in favor of the power amplifier 1023 providing the amplified RF signal directly to the antenna 1004.

The directional coupler 1044 senses an output signal of the power amplifier 1023. Additionally, the sensed output signal from the directional coupler 1044 is provided to the mixer 1058, which multiplies the sensed output signal by a reference signal of a controlled frequency. The mixer 1058 operates to generate a downshifted signal by downshifting the sensed output signal's frequency content. The downshifted signal can be provided to the ADC 1059, which can convert the downshifted signal to a digital format suitable for processing by the baseband processor 1001. Including a feedback path from the output of the power amplifier 1011 to the baseband processor 1001 can provide a number of advantages. For example, implementing the baseband processor 1001 in this manner can aid in providing power control, compensating for transmitter impairments, and/or in performing digital pre-distortion (DPD). Although one example of a sensing path for a power amplifier is shown, other implementations are possible.

As shown in FIG. 4A, the PA bias control circuit 1047 receives a bias control signal from the baseband processor 1001, and generates bias control signals for the power amplifier 1011. In the illustrated configuration, the bias control circuit 1047 generates bias control signals for both an input stage of the power amplifier 1023 and an output stage of the power amplifier 1023. However, other implementations are possible.

The switch control circuit 1050 can receive a control signal from the baseband processor 1001, and controls the bias voltage input to RF switch bias circuit 505. In the illustrated configuration, the switch control circuit 1050 generates a positive bias voltage +V (e.g., 2.5 V) for forward biasing the RF switch 506 via the RF switch bias circuit 505, and a second supply voltage −V (e.g., −2.5V) for reverse biasing the RF switch 506 via the RF switch bias circuit 505. The switch control circuit 1050 can control the voltage level of the positive or negative bias voltage to enhance the on-switching and/or off-switching duration of the amplified RF signal. In certain embodiments, the magnitude of the positive bias voltage can be greater than the magnitude of the negative bias voltage, or the magnitude of the negative bias voltage can be greater than the magnitude of the positive bias voltage. The switch control circuit 1050 can employ various power management techniques to change the voltage level of one or more of the supply voltages over time to improve the power amplifier's power added efficiency (PAE), thereby reducing power dissipation.

Figure 4B:
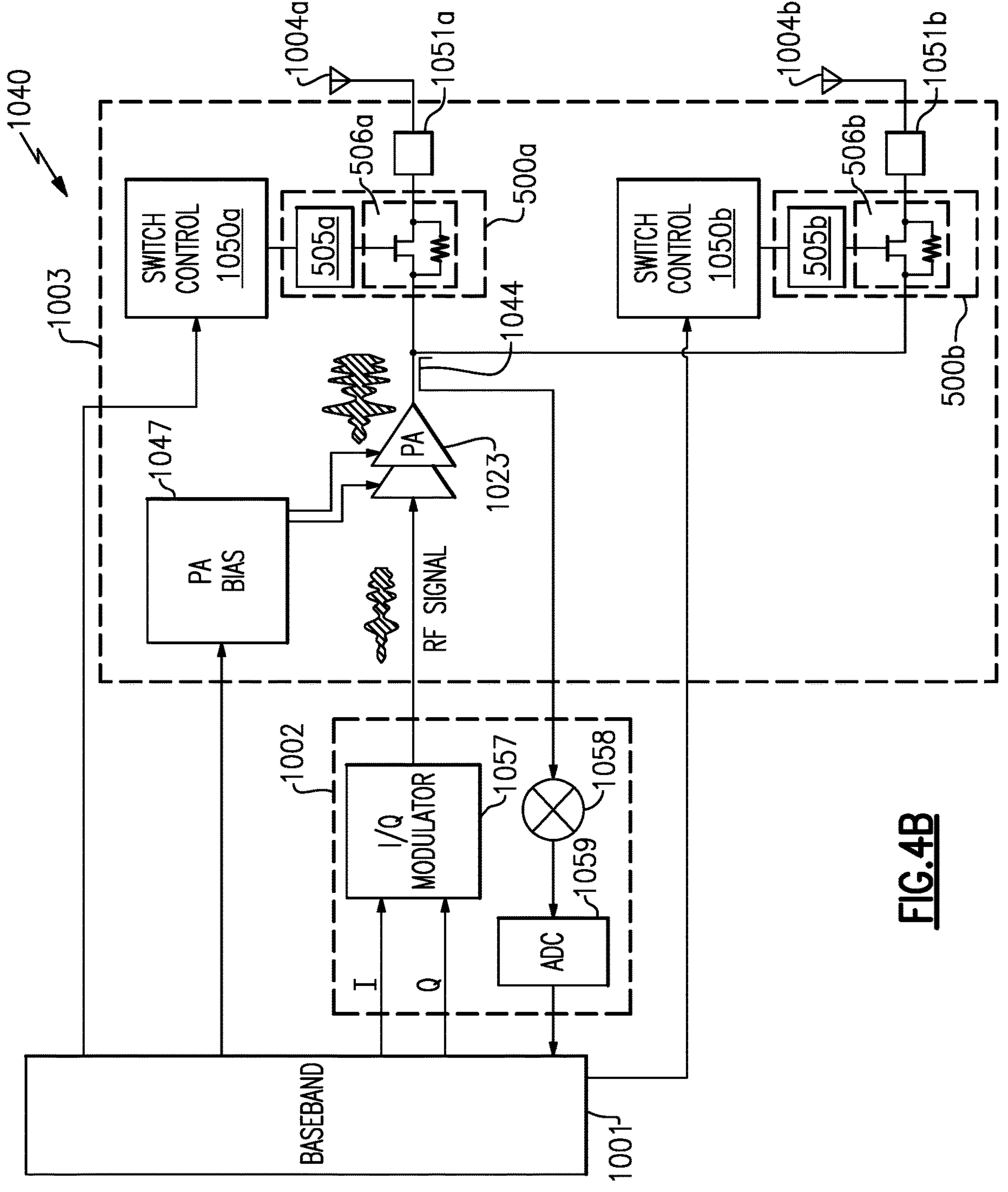
FIG. 4B is a schematic diagram of another power amplifier system including power amplifier switching circuitry where a power amplifier drives multiple antennas.

FIG. 4B is a schematic diagram of another power amplifier system 1040 including power amplifier switching circuitry 500*a*, 500*b* where the power amplifier 1023 drives multiple antennas 1004*a*, 1004*b*. As shown, the system 1040 includes first and second switch control circuits 1050*a*, 105*b* configured to control first and second RF amplifier switching circuit 500*a*, 500*b* that are each connected to the output of the power amplifier 1023. Like the system 1040 of FIG. 4A, the switch control circuits 1050*a*, 1050*b* can receive control signals from the baseband processor 1001 or another source for controlling the RF amplifier switching circuits 500*a*, 500*b*. The RF amplifier switching circuits 500*a*, 500*b* can each operate similarly to the RF amplifier switching circuit 500 of the system 1040 of FIG. 4A, and can respectively be connected to first and second sets of front end circuitry 1051*a*, 1051*b*, which are in turn connected to the antennas 1004*a*, 1004*b*.

In this fashion, the system 1040 of FIG. 4B can drive dual antennas 1004*a*, 1004*b* and/or implement MIMO functionality. In certain embodiments, the switches 506*a*, 506*b* can generally be on and off at different times such that the power amplifier 1023 drives one antenna at a time.

Figure 4C:
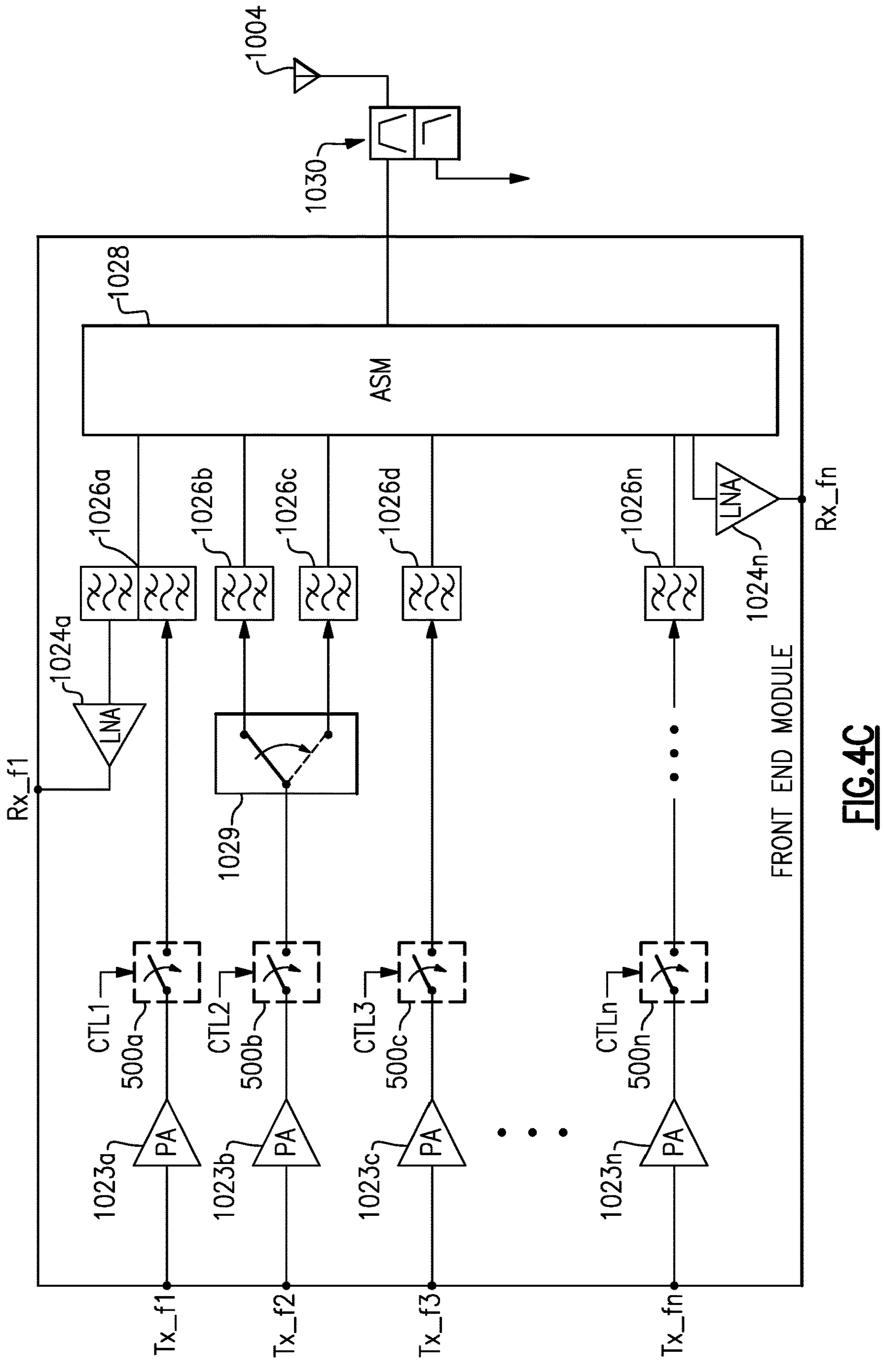
FIG. 4C is a schematic diagram of another power amplifier system including power amplifier switching circuitry connected between a set of power amplifiers and an antenna switch module.

FIG. 4C is a schematic diagram of another power amplifier system including RF power amplifier switching circuitry 500*a*-500*n* connected between a set of power amplifiers 1023*a*-1023*n* and an antenna switch module 1028. For example, the system 1040 can be implemented in a front end module as illustrated.

The system includes a diplexer 1030 connected to an antenna 1004. A first portion of the diplexer 1030 can pass signals from the antenna switch module 1028 to the antenna 1004. A second portion of the diplexer 1030 can be configured to connect another communication path (not shown in FIG. 4C) to the antenna 1004. For example, the first portion of the diplexer may pass signals over a first range of frequency bands and the second portion of the diplexer may pass signals over a second range of frequency bands.

The antenna switch module 1028 can be configured to selectively connect, to the first portion of the diplexer 1030, one or more of the filters 1026*a-n* or the low noise amplifier 1024*n*. While two low noise amplifiers 1024*a*, 1024*n* are shown in FIG. 4C, additional receive paths can be included as will be appreciated.

The duplexer 1026*a* includes a receive portion connected to a low noise amplifier 1024*a* and a transmit filter portion connected to the output of the first RF amplifier switching circuit 500*a*. For example, the transmit and receive filters of the duplexer 1026*a* can have passbands corresponding to uplink and downlink bands of an FDD communication band, allowing for simultaneous transmission of an amplified RF signal amplified by the first power amplifier 1023*a*, output by the RF amplifier switching circuit 500*a*, and reception of a signal detected by the antenna 1004 and amplified by the first low noise amplifier 1024*a*.

The second and third filters 1026*b*, 1026*c* are each connected to a respective output of a switch 1029, which can be a band select switch, for example. For instance, each filter 1026*b*, 1026*c* can have a passband corresponding to a different communication band, and the switch 1029 can connect the output of the second RF amplifier switching circuit 500*b* to the selected filter 1026*b*, 1026*c* corresponding to the currently active band, thereby allowing for transmission of a signal amplified by the second power amplifier 1023*b* by the antenna 1004. The second power amplifier 1023*b* can be configured to operate on a range of frequencies wide enough to include at least two communication bands.

The third through nth filters 1026*d*-1026*n* are each connected to a respective transmit chain including a power amplifier 1023*c*-1023*n* and RF amplifier control switch circuit 500*c*-500*n*, thereby allowing for driving of the antenna 1004 with signals amplified by any of the power amplifiers 1023*c*-1023*d*.

The antenna switch module 1028 is also connected to a low noise amplifier 1024*n*, which can be configured to amplify a signal received by the antenna 1004. Other transmit and receive paths can be included although not show in FIG. 4C.

The RF switching circuits 500*a*-500*n* can include any of the RF switching circuits described herein and can be controlled by corresponding switch control circuitry (not shown) that provides the control signals CTL1-CTLn to the respective RF switching circuits 500*a*-500*n*. For example, the switch control circuitry can be the same as the switch control circuitry 1050 shown and described with respect to FIG. 4A or FIG. 4B.

Figure 4D:
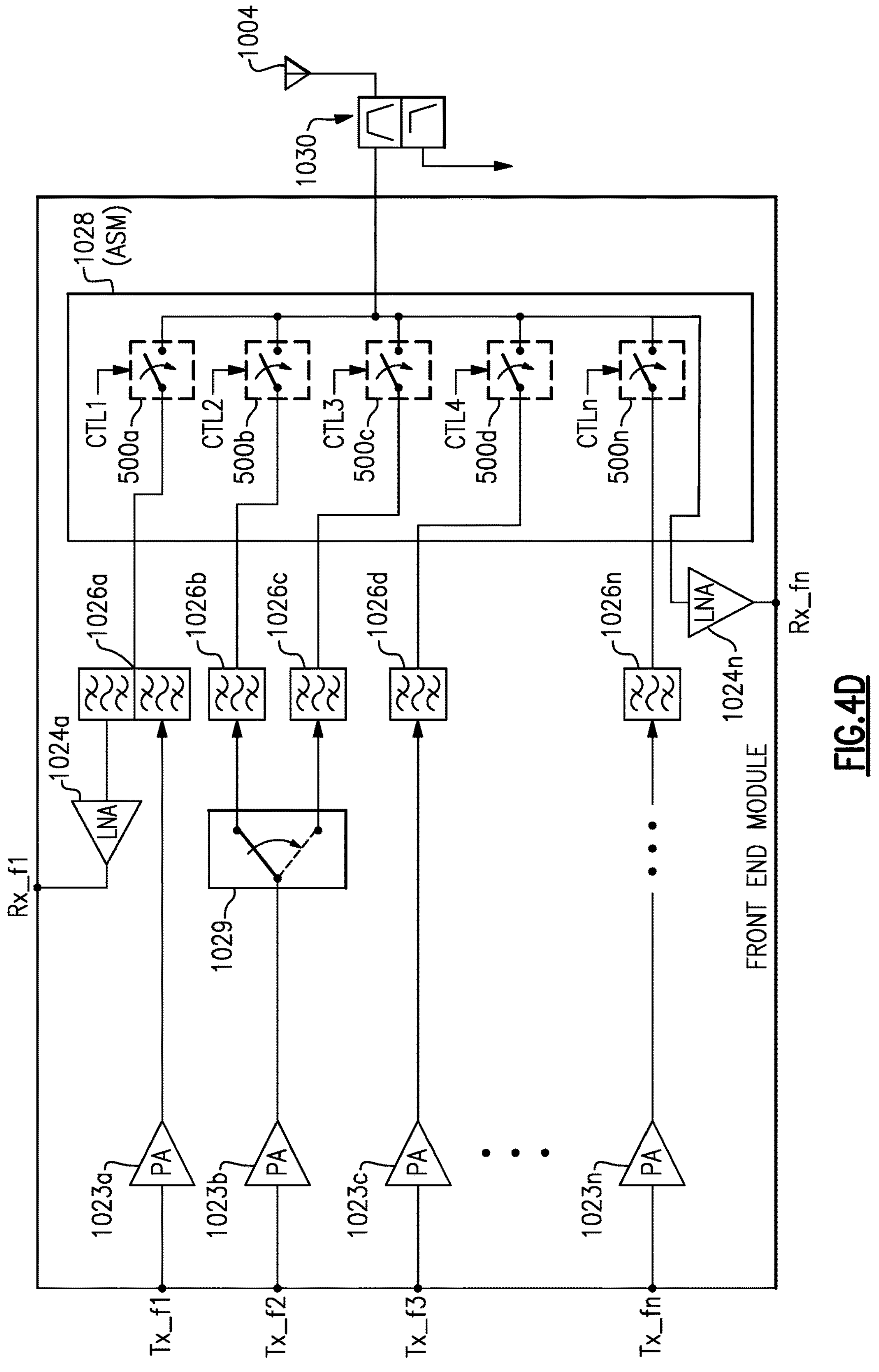
FIG. 4D is a schematic diagram of another power amplifier system including power amplifier switching circuitry incorporated into an antenna switch module.

FIG. 4D is a schematic diagram of another power amplifier system including power amplifier switching circuitry

500*a*-500*n* incorporated into an antenna switch module 1028. The system of FIG. 4D can be similar to that of FIG. 4C except that the RF amplifier switching circuits 500*a*-500*n* can be incorporated into the antenna switch module 1028, which can reduce complexity and ease integration.

Figure 5A:
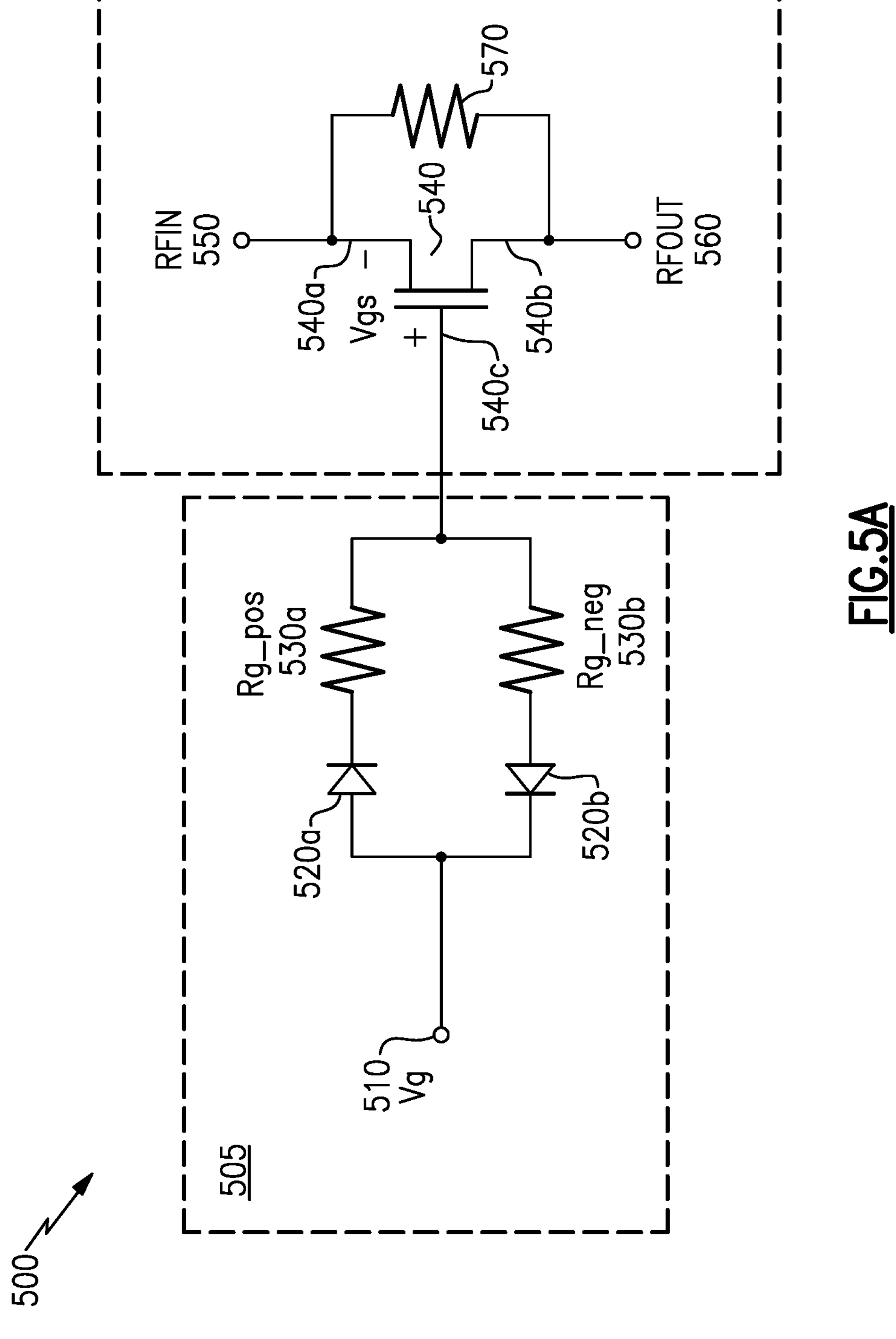
FIG. 5A is a schematic diagram of an RF amplifier switching circuit according to one embodiment of the present disclosure.

FIG. 5A is a schematic illustration of an RF amplifier switching circuit 500 including a RF switch bias circuit 505 and an RF switch 506 configured for rapid switching of RF signals, such as in the amplified signal provided by the power amplifiers 1023 of any of FIGS. 4A-4D. The RF switch bias circuit 505 includes a voltage input 510 configured to receive a variable voltage bias. As described with respect to FIG. 4A, the voltage bias can be supplied to the RF switch bias circuit 505 by the switch control circuit 1050. In other embodiments, the variable voltage bias can be provided directly from the baseband processor 1001 or some other voltage source, the voltage source alternating between a forward (positive) voltage bias and a reverse (negative) voltage bias to selectively pass the amplified RF signal provided on the RF input terminal 550 of the RF switch 506 to the RF output terminal 560 of the RF switch 506.

The RF switch 506 includes a transistor 540 having a source terminal 540*a*, a drain terminal 540*b*, and a gate terminal 540*c*. The transistor 540 can be a metal-oxide semiconductor field-effect transistor (MOSFET) or a metal-semiconductor field-effect transistor (MESFET), though other types of transistors may be used. Although certain types of transistors (for example, junction transistors) do not have gate, drain, and source terminals, the schematic layout of the RF switch 506 may be adapted for compatibility with electrically different types of transistors. For example, where the gate terminal 540*c* is shown in FIG. 5A, a base terminal of a bi-polar junction transistor (BJT) may be connected instead. Correspondingly, a collector and/or emitter terminal may be used in place of the source or drain terminals 540*a*/540*b*. In certain implementations, the RF switch 506 can include two or more transistors 540 representing a plurality of RF signal paths, wherein each transistor can be of the same type or of different types.

The voltage input 510 is electrically connected to the gate terminal 540*c* of the transistor 540 by a forward biasing network and a reverse biasing network. The forward biasing network includes at least a first diode 520*a* and a first resistor 530*a*, whereas the reverse biasing network includes at least a second diode 520*b* and a second resistor 530*b*. The first diode 520*a* and the first resistor 530*a* are arranged in series in a forward direction such that a current passes between the voltage input 510 and the gate terminal 540*c* when a forward bias voltage is applied at the input 510. Conversely, The second diode 520*b* and the second resistor 530*b* are arranged in series in a reverse direction such that a current passes between the gate terminal 540*c* and the voltage input 510 when a reverse bias voltage is applied at the input 510.

Therefore, regardless of the polarity of the bias voltage, only one of the forward signal path or the reverse signal path will have an appreciable current passing between the voltage input 510 and the transistor 540 at any given time. (Reverse saturation current of the diodes 530*a/b* is negligible.) In certain embodiments, a third biasing network (such as, a bypass network) may be present in the bias circuit and selectively enabled to allow bidirectional current flow between the voltage input 510 and transistor 540.

The source terminal 540*a* and the drain terminal 540*b* behave as an RF input 550 and an RF output 560 of the RF switch 506, respectively. The transistor 540 and a third resistor 570 arranged in parallel across the source and drain terminals 540*a/b* provide an RF signal path to selectively pass the RF input signal (e.g., provided by the power amplifier 1023) between the RF input 550 and the RF output 560. The third resistor 570 preferably has a relatively high resistance value, to attenuate the RF input signal between the RF input 550 and the RF output 560 when the signal is not being passed by the transistor 540. The voltage and polarity of the bias applied at the voltage input 510 of the RF switch bias circuit 505 can be adjusted to rapidly change the operating mode of the transistor 540.

Figure 5B:
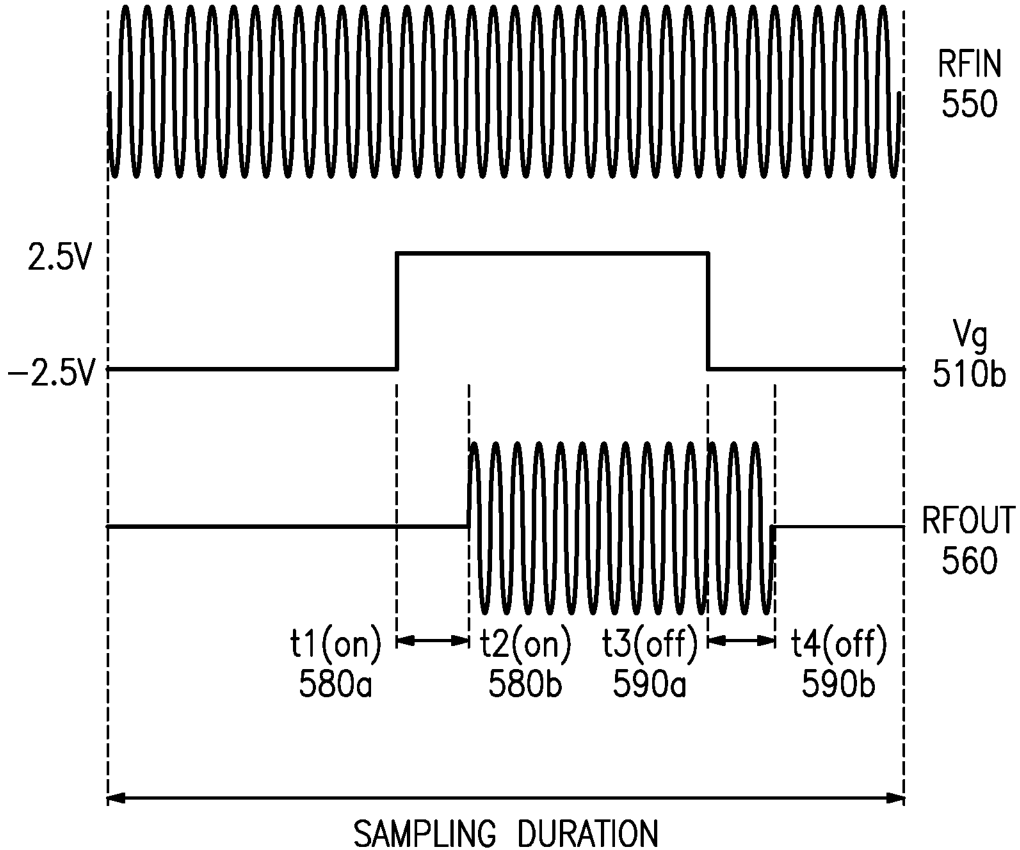
FIG. 5B illustrates transient behavior of an RF signal passing through an RF amplifier switching circuit.

FIG. 5B illustrates transient behavior of an RF signal passing through an ideal RF amplifier switching circuit during switching, exemplifying the theory of operation behind the RF amplifier switching circuit 500 of FIG. 5A. A sinusoidal input signal present at the RF signal input 550 is applied for the entire sampling duration. Initially, a reverse bias of negative 2.5V is applied at the voltage input 510, causing the transistor to operate in the cut-off region and preventing the amplified RF signal from being passed to the RF output 560 of the RF switch 506. At a first time 580*a* (t1), the bias voltage is instantly switched to a forward bias of 2.5V. After a brief on-switching delay, at a second time 580*b* (t2), the transistor switches to operate in the active region and allows the RF signal to propagate to the RF output 560.

At a third time 590*a* (t3), the bias voltage is abruptly switched back to the reverse bias. After an off-switching delay, at a fourth time 590*b* (t4), the transistor switches back to operating in the cut-off region, and the RF output 560 no longer passes the input signal through the transistor.

Adjusting the duration of the on-switching and off-switching delays can improve radio performance by reducing spurious emissions associated with so-called "hot switching" while RF power is present. Advantageously, the on-switching delay and the off-switching delay of the RF amplifier switching circuit 500 of FIG. 5A can be adjusted separately by selecting different values of resistance for the first resistor 530*a* and the second resistor 530*b*.

Figures 6A, 6B:
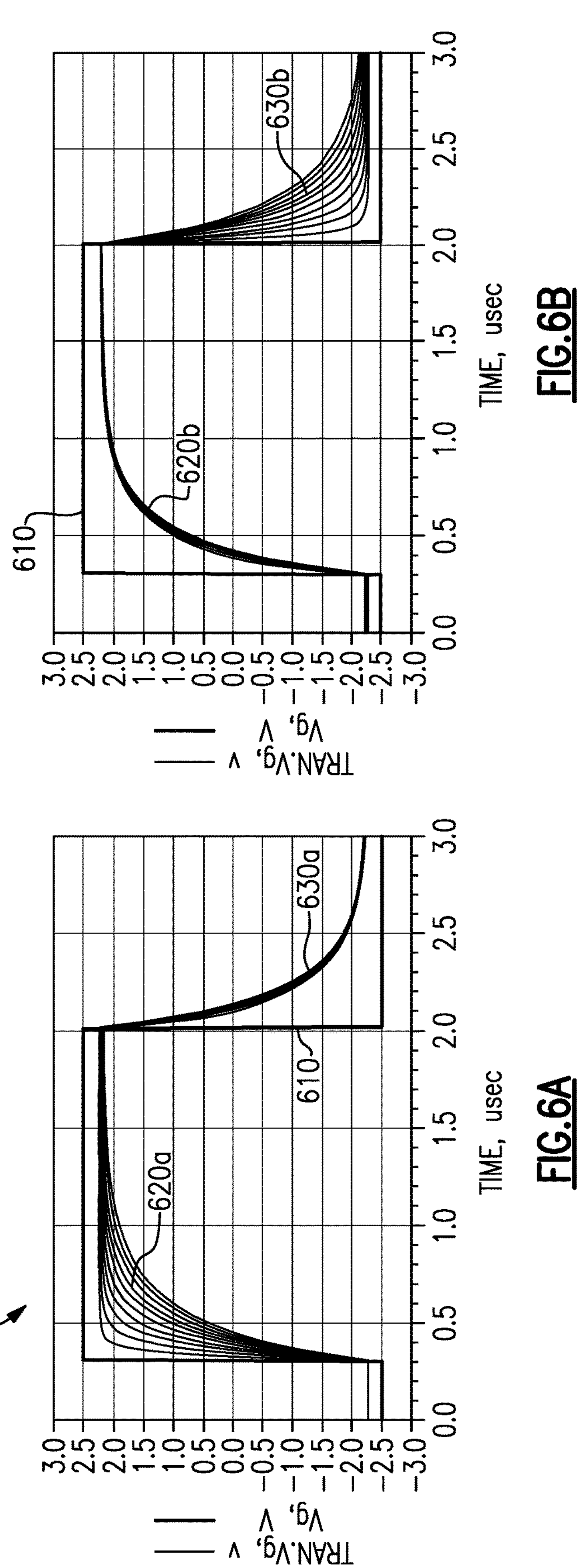
FIG. 6A illustrates transient behavior of a voltage potential $V_{gs}$ for the RF amplifier switching circuit of FIG. 5A with variously configured on-times during on-off switching.
FIG. 6B illustrates transient behavior of the voltage potential $V_{gs}$ for the RF amplifier switching circuit of FIG. 5A with variously configured off-times during on-off switching.

Referring now to FIGS. 6A and 6B, FIG. 6A illustrates a voltage transient of a potential $V_{gate\text{-}source}$ ($V_{gs}$) measured between the gate terminal 540*c* and the source terminal 540*a* for several embodiments of an RF amplifier switching circuit constructed according to FIG. 5A. Each embodiment of the RF switch bias circuit 505 has a different resistance value of the first resistor 530*a*, ranging between 25 kΩ and 250 kΩ, to demonstrate variously configured on-times during on-off switching.

A voltage bias 610 represented by a rectangular function having the formula $$V(t) = 5\Pi\left(\frac{t-1.15}{1.7}\right) - 2.5$$

is applied at the voltage input 510 of each of the bias circuits 505 for the interval t=[0,3] microseconds. As the voltage bias 610 transitions from a reverse bias to a forward bias at approximately t=0.3 microseconds, each transistor 540 of the RF switch 506 enter the active region at a different rate based on the resistance of the selected first resistor 530*a*. This is shown by a first plurality of on-switching curves 620*a*, wherein relatively lower values of resistance (e.g., 25 kΩ) cause the transistors 540 to transition more rapidly during on-switching. At approximately t=2 microseconds, because the bias circuits 505 each have a same value of the second resistor 530*b* (e.g., 200 kΩ), the transistors return to the cut-off region shown by an off-switching curve 630*a*.

FIG. 6B illustrates the transient of $V_{gs}$ for several RF amplifier switching circuits wherein each RF switch bias circuit 505 of each RF amplifier switching circuit has a different resistance value of the second resistor 530*b*, ranging between 25 kΩ and 250 kΩ, to demonstrate variously configured off-times during on-off switching. At approximately t=0.3 microseconds, because the several bias circuits 505 each have a same value of the first resistor 530*a*, the transistors enter the active region at the same rate as shown by an on-switching curve 620*b*.

As the voltage bias 610 transitions from a forward bias to a reverse bias at approximately t=2 microseconds, each transistor 540 of the RF switch 506 enter the cut-off region at a different rate based on the resistance of the selected second resistor 530*b*. This is shown by a plurality of off-switching curves 630*b*, wherein relatively lower values of resistance (e.g., 25 kΩ) cause the transistors 540 to transition more rapidly during off-switching. Although on-switching is generally desired to be as fast as possible, the off-switching duration can be extended to reduce spurious emissions created by hot switching while RF power is applied to the transistor 540. As will be discussed herein, the concepts illustrated by FIGS. 6A and 6B can be combined in a bias circuit with independently controllable on and off-switching times.

Figure 7:
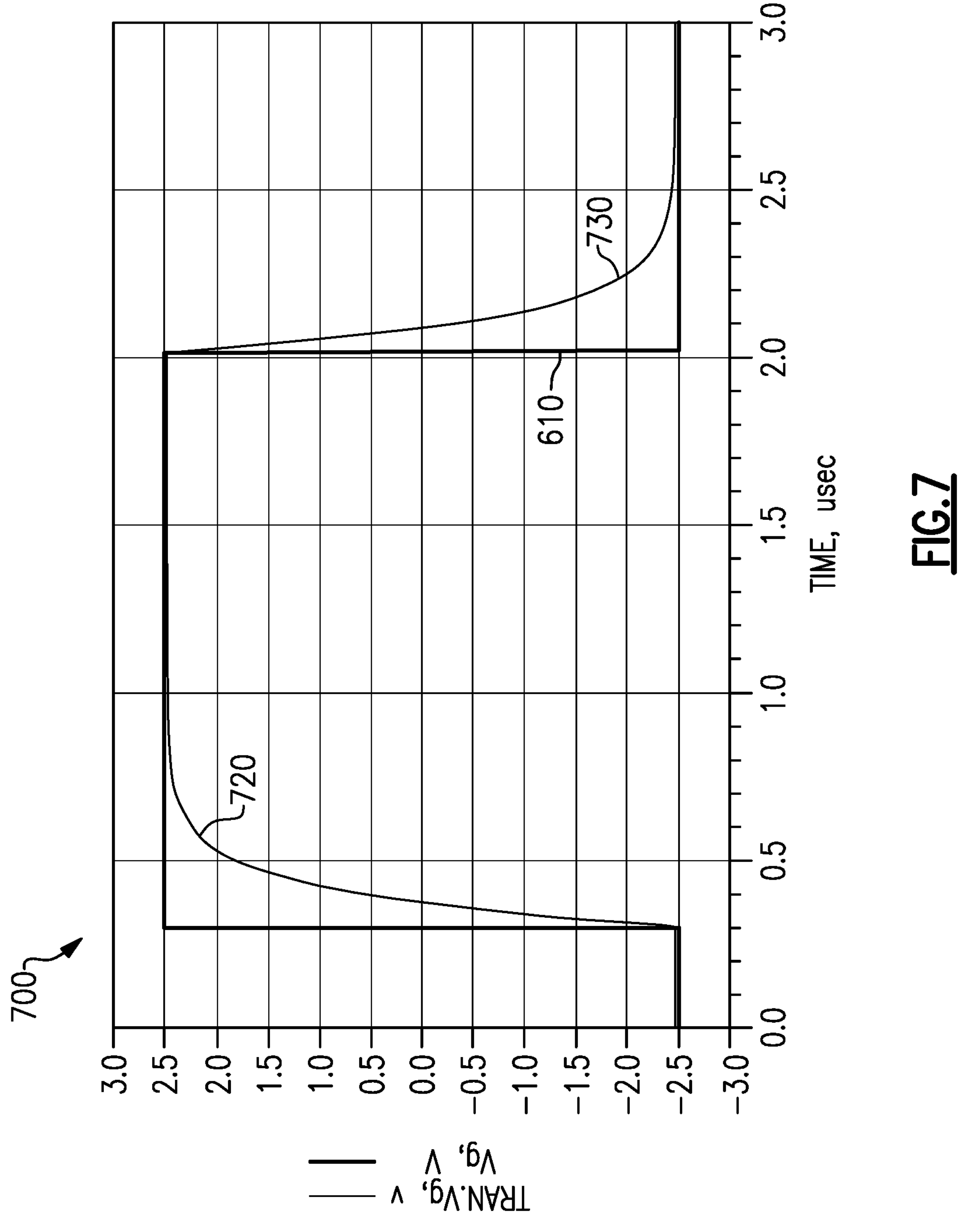
FIG. 7 illustrates transient behavior of a voltage potential $V_{gs}$ for an RF amplifier switching circuit without independently controllable on-off times during on-off switching.

FIG. 7 illustrates a voltage transient 700 of a potential $V_{gs}$ for an RF amplifier switching circuit constructed with a bias network having only a single 100 kΩ resistor. Compared to the embodiment of FIG. 5A and the voltage transients of FIGS. 6A and 6B, this RF amplifier switching circuit does not include separate forward and a reverse biasing networks, and therefore lacks independently controllable on and off-switching times. When a voltage bias 610 is applied to the single-resistor bias network of the RF amplifier switching circuit, the rise time during on-switching (shown by an on-switching curve 720) is substantially the same as the fall time during off-switching (shown by an off-switching curve 730). Therefore, the single-resistor bias network is not well-suited to rapid switching applications, particularly those sensitive to RF noise. As will be discussed herein, other features of the forward and reverse biasing networks can provide additional advantages not offered by a single-resistor bias circuit.

Figures 8A, 8B:
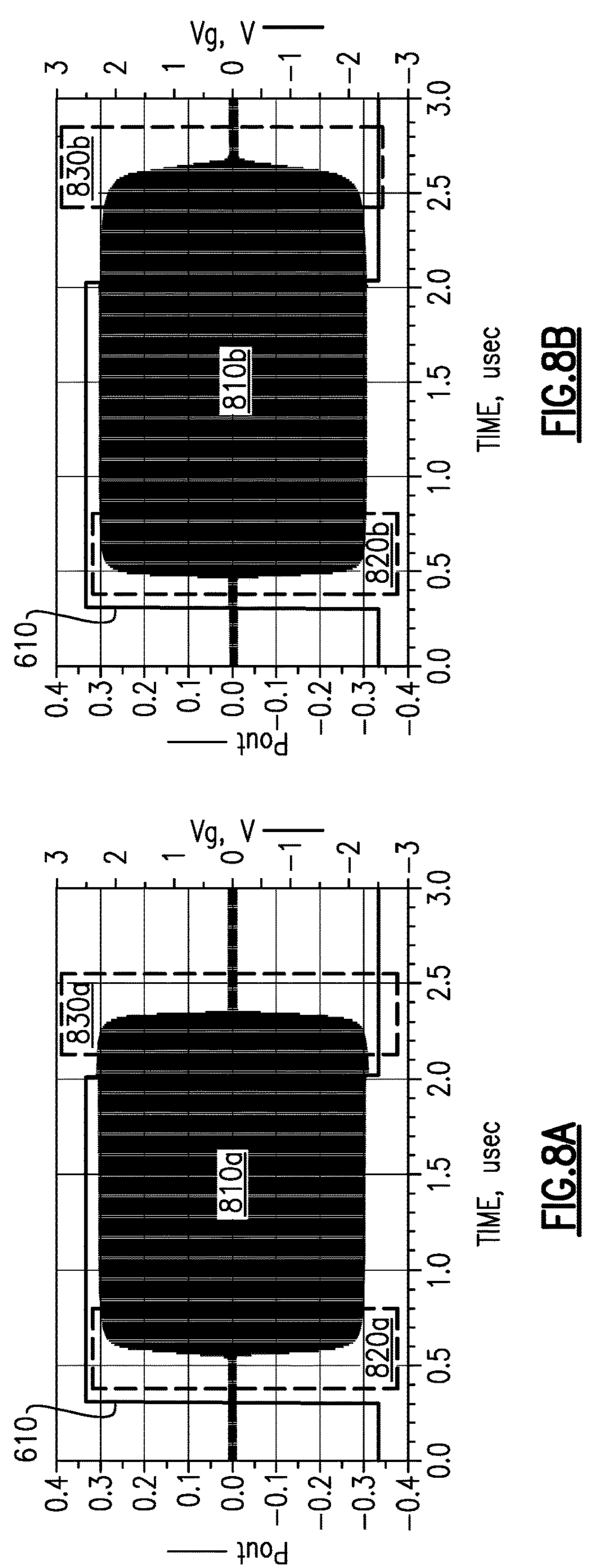
FIG. 8A illustrates measured RF power during on-off switching by an RF amplifier switching circuit without independently controllable on-off times during on-off switching.
FIG. 8B illustrates measured RF power during on-off switching by the RF amplifier switching circuit of FIG. 5A.

FIGS. 8A and 8B illustrate RF power output 800 during on-off switching of an RF amplifier switching circuit by a single-resistor bias network and the RF switch bias circuit 505 of FIG. 5A, respectively. In FIG. 8A, RF power 810*a* measured from an RF output of the single-resistor RF amplifier switching circuit is plotted alongside the voltage bias 610 over a period of 3 microseconds. As the voltage bias 610 alternates from a reverse bias of negative 2.5V to a forward bias of positive 2.5V, the transistor transitions from the cut-off region to the active region during an on-switching phase 820*a* to allow an RF input to pass. Similarly, the transistor transitions back to the cut-off region during an off-switching phase 830*a* when the voltage bias 610 alternates back to the reverse bias. Because the single-resistor RF amplifier switching circuit does not support independent on-off switching times, it can be seen that the single 100 kΩ resistor produces symmetrical, opposite curves in the on-switching phase 820*a* and the off-switching phase 830*a*.

FIG. 8B shows RF power 810*b* measured from the RF output 560 of the RF amplifier switching circuit 500 of FIG. 5A over the same period. In this example, the resistance of the first resistor 530*a* of the forward biasing network is 50 kΩ, and the resistance of the second resistor of the reverse biasing network is 400 kΩ. As the voltage bias 610 alternates from reverse bias to forward bias, the transistor 540 rapidly transitions from the cut-off region to the active region during an on-switching phase 820*b* to allow the RF input to pass. Due to the relatively low resistance of the first resistor 530*a*, the rise in RF power 810*b* during the on-switching phase 820*b* is noticeably steeper than in the on-switching phase 820*a* of FIG. 8A. Similarly, when the voltage bias 610 alternates back to the reverse bias, the transistor 540 transitions to the cut-off region during an off-switching phase 830*b*. However, compared to the off-switching phase 830*a* of FIG. 8A, the reduction in RF power during the off-switching phase 830*b* is more gradual owing to the greater resistance of the second resistor 530*b* in the reverse biasing network. This illustrates how the forward and reverse biasing networks, by selection of resistor values, can be configured to produce asymmetrical curves in the on-switching phase 820*b* and the off-switching phase 830*b*, and therefore separately controllable on and off-switching times.

Figures 9A, 9B:
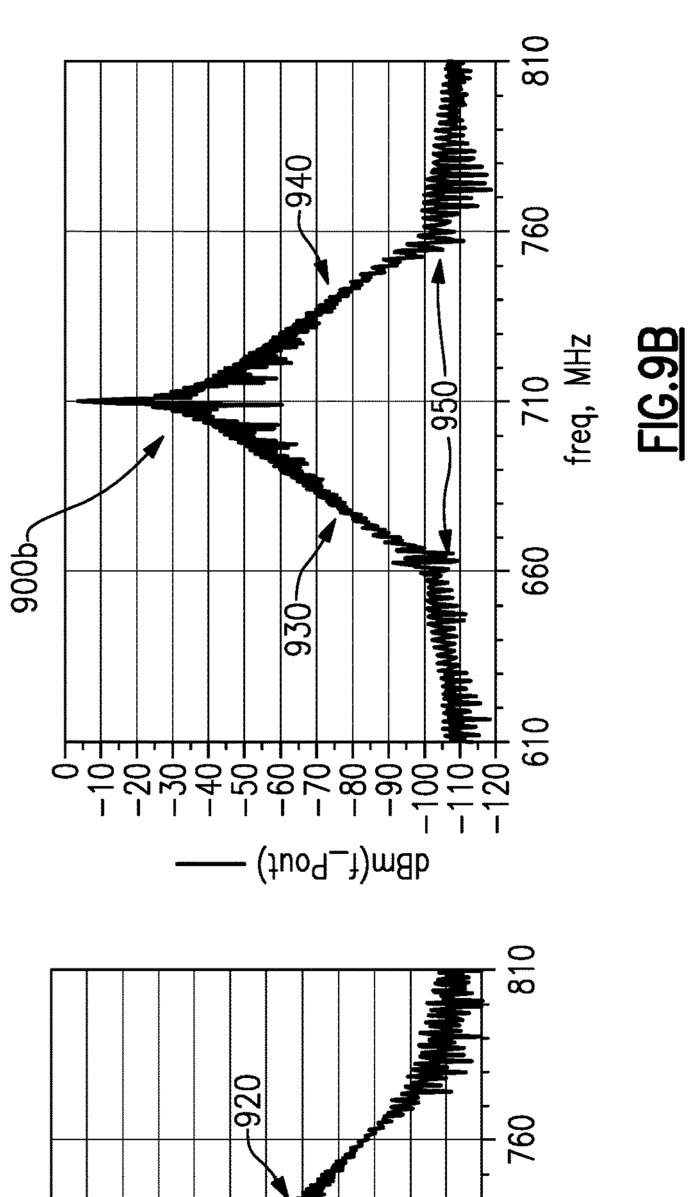
FIG. 9A illustrates a frequency response representing spurious RF emissions during on-off switching by an RF amplifier switching circuit without independently controllable on-off times.
FIG. 9B illustrates a frequency response representing spurious RF emissions during on-off switching by the RF amplifier switching circuit of FIG. 5A.

FIG. 9A illustrates a frequency response 900*a* during on-off switching by a single-resistor RF amplifier switching circuit. As a 710 MHz RF input signal is passed to the bias circuit, spurious emissions at a first 30 MHz offset 910 (680 MHz) can be measured at −65.9 dBm relative to a 710 MHz peak. Correspondingly, spurious emissions at a second 30 MHz offset 920 (740 MHz) can be measured at approximately −66.5 dBm below the peak. The frequency response 900 falls off roughly linearly between about 640-700 MHz, and again between about 720-780 MHz, meaning that attenuation of spurious emissions by the single-resistor bias circuit can be inadequate for rapid switching applications, particularly at ultra-high frequencies (UHF) and above.

FIG. 9B illustrates a frequency response 900*b* during on-off switching by the RF amplifier switching circuit 500 of FIG. 5A receiving the same 710 MHz RF input. Compared to the response of FIG. 9A, spurious emissions at a third 30 MHz offset 930 (680 MHz) are roughly −75.2 dBm relative to the 710 MHz peak, and spurious emissions at a fourth 30 MHz offset 940 (740 MHz) are approximately −75.6 dBm below the peak. Comparing the linear regions of the response 900*b* with those of FIG. 9A, the linear regions are in a narrower frequency range (approximately 665-700 MHz and 720-755 MHz) and have steeper curves, representing a higher degree of attenuation at distant frequencies. Below approximately 665 MHz and above 755 MHz, the response 900*b* plateaus to roughly −110 dBm below the 710 MHz peak, representing a substantial reduction in spurious emissions at these frequencies.

Figure 10:
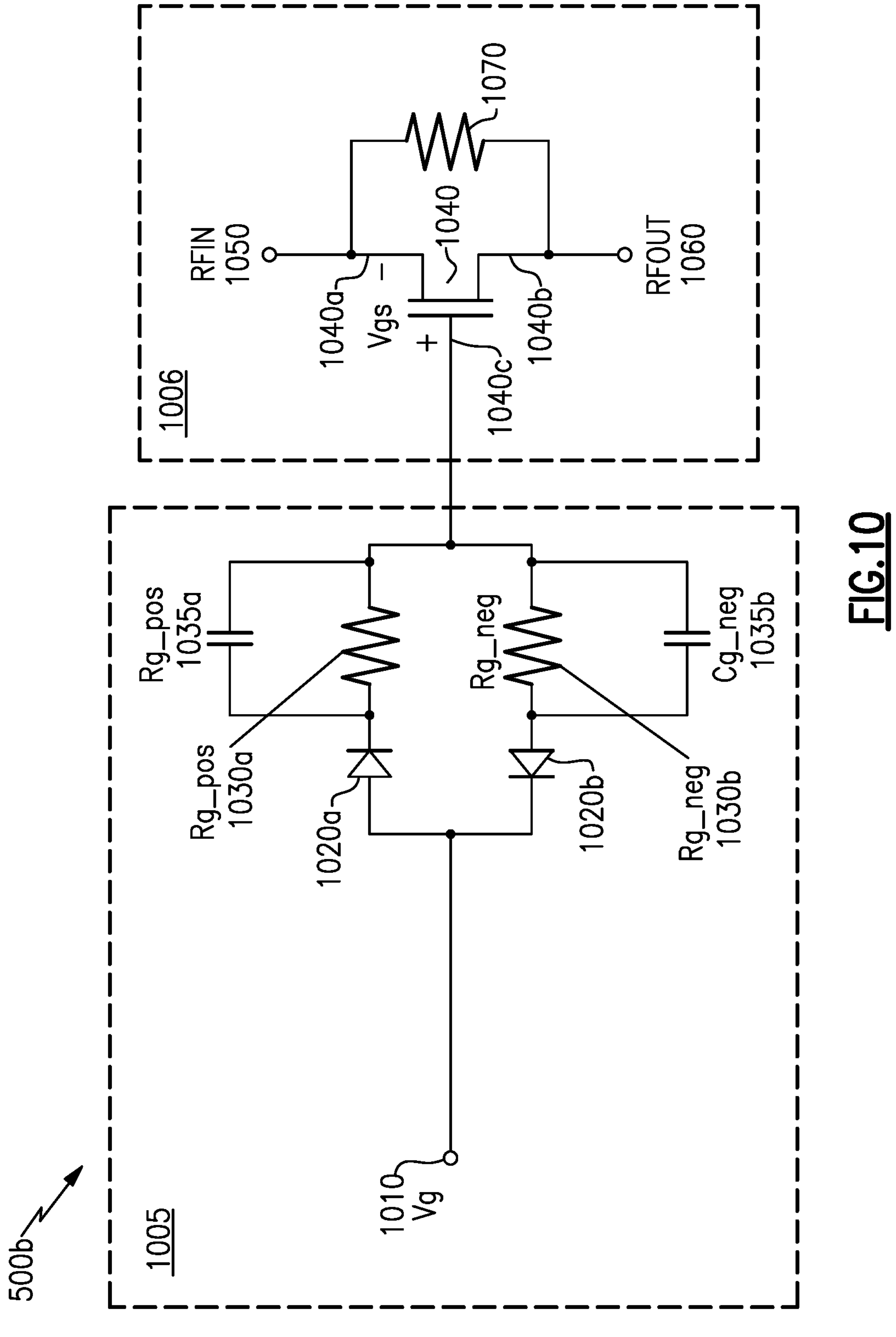
FIG. 10 is a schematic diagram of an RF amplifier switching circuit according to an additional embodiment of the present disclosure.

FIG. 10 is a schematic diagram of an additional embodiment of an RF amplifier switching circuit 500*b*, including a RF switch bias circuit 505 having a forward biasing network and a reverse biasing network, and an amplifier circuit 506. The RF switch bias circuit 505 includes a voltage input 55 configured to receive a variable voltage bias, and the amplifier circuit 506 includes a transistor 540 having a source terminal 540*a*, a drain terminal 540*b*, and a gate terminal 540*c*. The amplifier circuit 506 further includes an RF signal input 550 at the source terminal 540*a*, an RF signal output 560 at the drain terminal 540*b*, and a third resistor 570 connected across the RF signal input and the RF signal output.

The voltage Input 510 is electrically connected to the gate terminal 540*c* of the transistor 540 by the forward biasing network and the reverse biasing network. The forward biasing network includes at least a first diode 520*a*, a first resistor 530*a*, and a first capacitor 535*a*, whereas the reverse biasing network includes at least a second diode 520*b*, a second resistor 530*b*, and a second capacitor 535*b*. The first resistor 530*a* and first capacitor 535*a* are arranged in parallel, and the first diode 520*a* is configured in series with the resistor and capacitor in a forward direction such that a current passes between the voltage input 510 and the gate terminal 540*c* when a forward bias voltage is applied at the input 510. Conversely, The second resistor 530*b* and second capacitor 535*b* are arranged in parallel, and the second diode 520*b* is configured in series with the resistor and capacitor in a reverse direction such that a current passes between the gate terminal 540*c* and the voltage input 510 when a reverse bias voltage is applied at the input 510. The resistors 530*a/b* and capacitors 535*a/b* can both be selected for independently controllable on and off-switching times of the transistor 540.

Figures 11A, 11B:
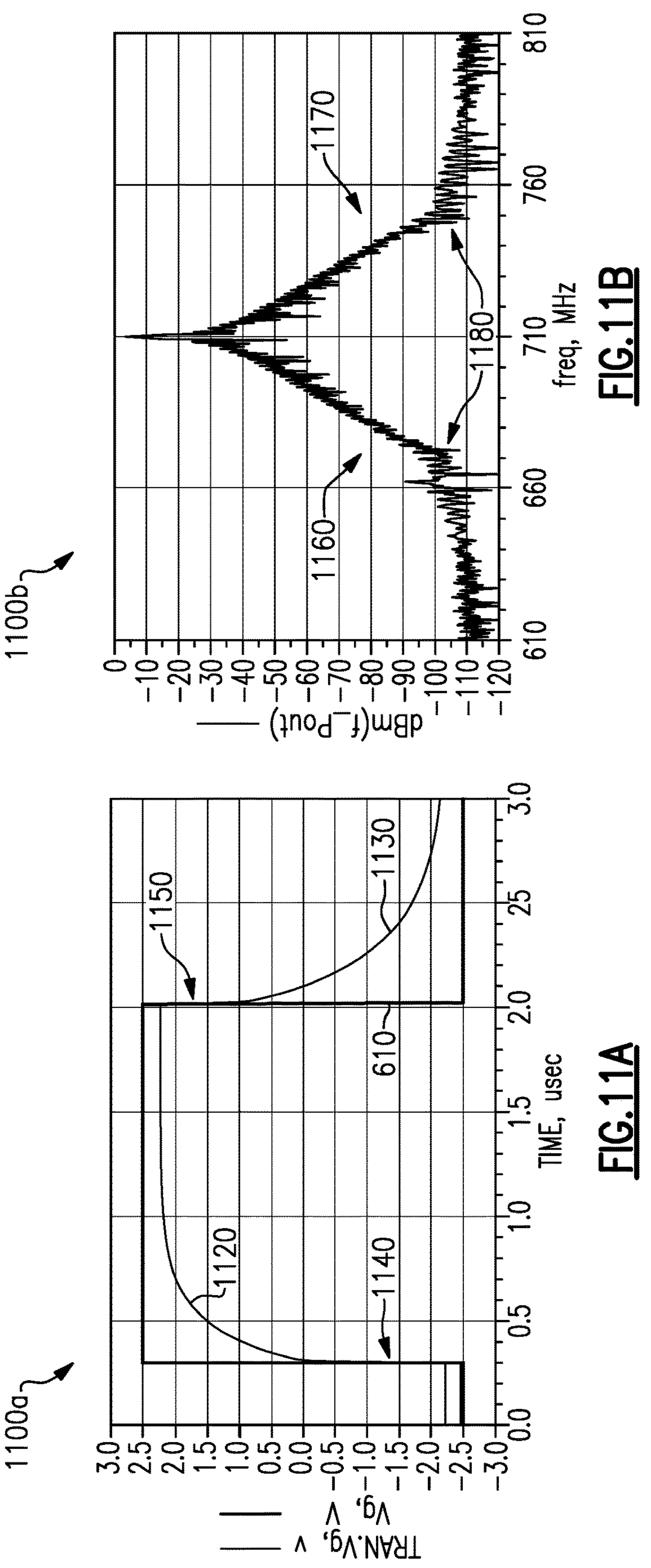
FIG. 11A illustrates transient behavior of a voltage potential $V_{gs}$ for the RF amplifier switching circuit of FIG. 10 during on-off switching
FIG. 11B illustrates a frequency response representing spurious RF emissions during on-off switching by the RF amplifier switching circuit of FIG. 10.

FIG. 11A illustrates a voltage transient 1100*a* of a potential $V_{gs}$ for the RF amplifier switching circuit 500*b* of FIG. 10 during on-off switching. Compared to the voltage transients of FIGS. 6A and 6B, the forward and reverse biasing networks of the RF switch bias circuit 505 can charge the first and second capacitors 535*a/b* to transition between operating regions of the transistor 540 more rapidly. For example, when a positive voltage bias 610 is applied to the RF switch bias circuit 505 at t=0.3 microseconds, $V_{gs}$ jumps to 0V at the off-on transition 1140 due to discharge of the first capacitor 535*a*. This initial jump allows the on-switching curve 1120 to rapidly approach a stable voltage even at higher values of resistance for the first resistor 530*a*. Likewise, when a negative voltage bias 610 is applied to the RF switch bias circuit 505 at t=2 microseconds, there is an initial decrease in $V_{gs}$ at the on-off transition 1150 due to discharge of the second capacitor 535*b*.

The capacitance of each of the first and second capacitors 535*a/b* can be selected to complement the first and second resistors 530*a/b* to achieve a desired on-switching time and off-switching time. For example, the first capacitor 535*a* in the forward biasing network can be selected to have a relatively high capacitance when rapid on-switching of the RF amplifier switching circuit 500*b* is required. It will be appreciated by those skilled in the art that the first and second capacitors 535*a/b* can be combined with any of the embodiments of FIGS. 5-7 to achieve even more rapid switching results. In certain embodiments, the RF switch bias circuit 505 may only include a capacitor in one of the biasing networks (for example, the forward biasing network) as a space-saving measure.

FIG. 11B illustrates a frequency response 1100*b* representing spurious RF emissions during on-off switching by the RF amplifier switching circuit 500*b* of FIG. 10. In this example, the first resistor 530*a* is an 80 kΩ resistor, the second resistor 530*b* is a 200 kΩ resistor, the first capacitor 535*a* is 1 pF capacitor, and the second capacitor 535*b* is a 0.3 pF capacitor. The RF amplifier switching circuit 500*b* receives substantially the same 710 MHz RF input as in the examples of FIGS. 9A and 9B.

Compared to the frequency response 900*a* and 900*b* of FIGS. 9A and 9B, spurious emissions from the RF amplifier switching circuit 500*b* of FIG. 10 are lower than a single-resistor RF amplifier switching circuit and even the RF amplifier switching circuit 500 of FIG. 5A. For example, spurious emissions at a fifth 30 MHz offset 1160 (680 MHz) are at roughly −82.2 dBm relative to the 710 MHz peak, and spurious emissions at a sixth 30 MHz offset 1170 (740 MHz) are approximately −82.3 dBm below the peak. The frequency response 1100*b* exhibits narrow linear regions above and below the input frequency, between approximately 670-700 MHz and 720-750 MHz, representing a higher degree of attenuation at distant frequencies. Beyond these linear regions, the response 1100*b* plateaus to roughly −110 dBm below the 710 MHz peak, representing a substantial reduction in spurious emissions, and an improvement over the embodiments of FIGS. 5-7.

Mobile Device and RF Front-End System

Figure 12:
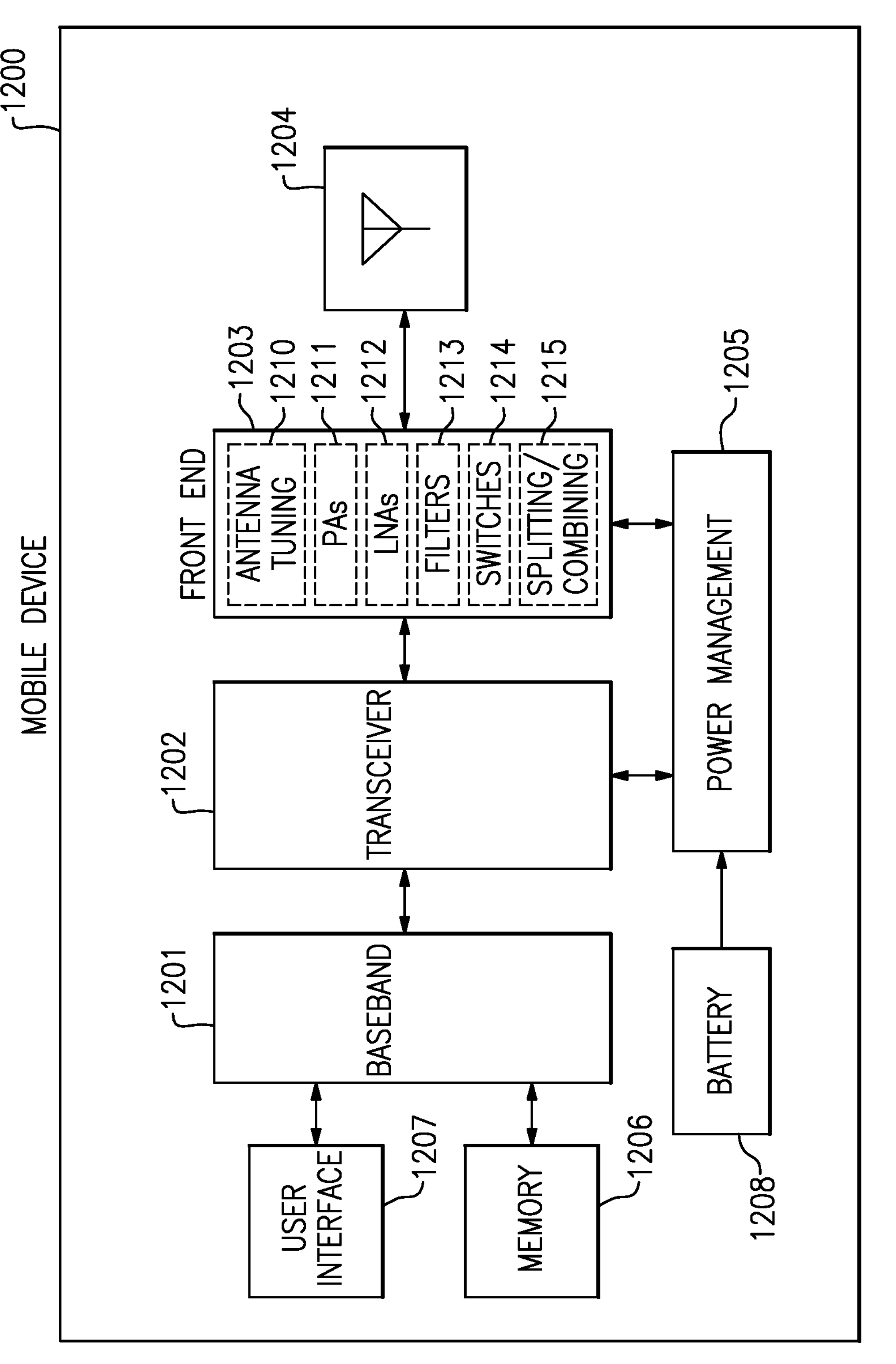
FIG. 12 is a schematic diagram of one embodiment of a mobile device.

FIG. 12 is a schematic diagram of one embodiment of a mobile device 1200. The mobile device 1200 includes a baseband system 1201, a transceiver 1202, a front-end system 1203, antennas 1204, a power management system 1205, a memory 1206, a user interface 1207, and a battery 1208.

The mobile device 1200 can additionally include any of the RF amplifier switching circuits described herein, such as the RF amplifier switching circuit 500 of FIGS. 4 and 5A, or the RF amplifier switching circuit 500*b* of FIG. 10.

The mobile device 1200 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 1202 generates RF signals for transmission and processes incoming RF signals received from the antennas 1204. It will be understood that various functionalities associated with the transmission and receiving of RF signals can be achieved by one or more components that are collectively represented in FIG. 12 as the transceiver 1202. In one example, separate components (for instance, separate circuits or dies) can be provided for handling certain types of RF signals.

The front-end system 1203 aids in conditioning signals transmitted to and/or received from the antennas 1204. In the illustrated embodiment, the front-end system 1203 includes antenna tuning circuitry 1210, power amplifiers (PAs) 1211, low noise amplifiers (LNAs) 812, filters 1213, switches 1214, and signal splitting/combining circuitry 1215. However, other implementations are possible.

For example, the front-end system 1203 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1200 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 1204 can include antennas used for a wide variety of types of communications. For example, the antennas 1204 can include antennas for transmitting and/or receiving signals associated with a wide variety of frequencies and communications standards.

In certain implementations, the antennas 1204 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1200 can operate with beamforming in certain implementations. For example, the front-end system 1203 can include amplifiers having controllable gain and phase shifters having controllable phase to provide beam formation and directivity for transmission and/or reception of signals using the antennas 1204. For example, in the context of signal transmission, the amplitude and phases of the transmit signals provided to the antennas 1204 are controlled such that radiated signals from the antennas 1204 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 1204 from a particular direction. In certain implementations, the antennas 1204 include one or more arrays of antenna elements to enhance beamforming.

The baseband system 1201 is coupled to the user interface 1207 to facilitate processing of various user input and output (I/O), such as voice and data. The baseband system 1201 provides the transceiver 1202 with digital representations of transmit signals, which the transceiver 1202 processes to generate RF signals for transmission. The baseband system 1201 also processes digital representations of received signals provided by the transceiver 1202. As shown in FIG. 12, the baseband system 1201 is coupled to the memory 1206 of facilitate operation of the mobile device 1200.

The memory 1206 can be used for a wide variety of purposes, such as storing data and/or instructions to facilitate the operation of the mobile device 1200 and/or to provide storage of user information.

The power management system 1205 provides a number of power management functions of the mobile device 1200. In certain implementations, the power management system 1205 includes a PA supply control circuit that controls the supply voltages of the power amplifiers 1211. For example, the power management system 1205 can be configured to change the supply voltage(s) provided to one or more of the power amplifiers 1211 to improve efficiency, such as power added efficiency (PAE). The power management system 1205 can include PMUs implemented in accordance with the teachings herein. Thus, the power management system 1205 can be implemented in accordance with any of the embodiments herein, and serves as a power management subsystem for UE.

As shown in FIG. 12, the power management system 1205 receives a battery voltage from the battery 1208. The battery 1208 can be any suitable battery for use in the mobile device 1200, including, for example, a lithium-ion battery.

Figure 13A:
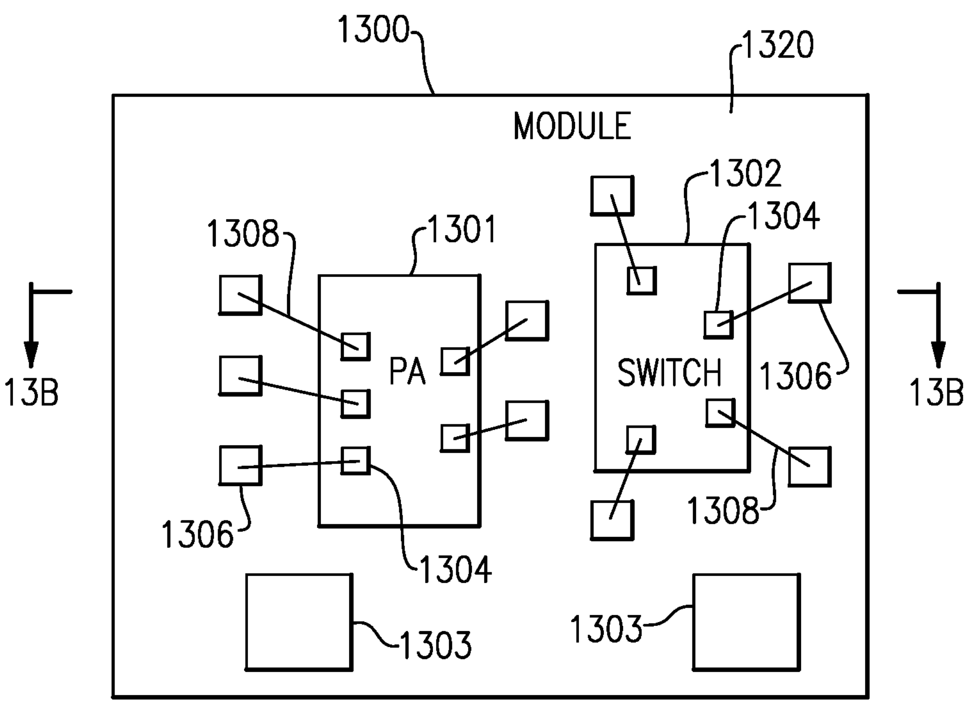
FIG. 13A is a schematic diagram of one embodiment of a packaged module.
Figure 13B:
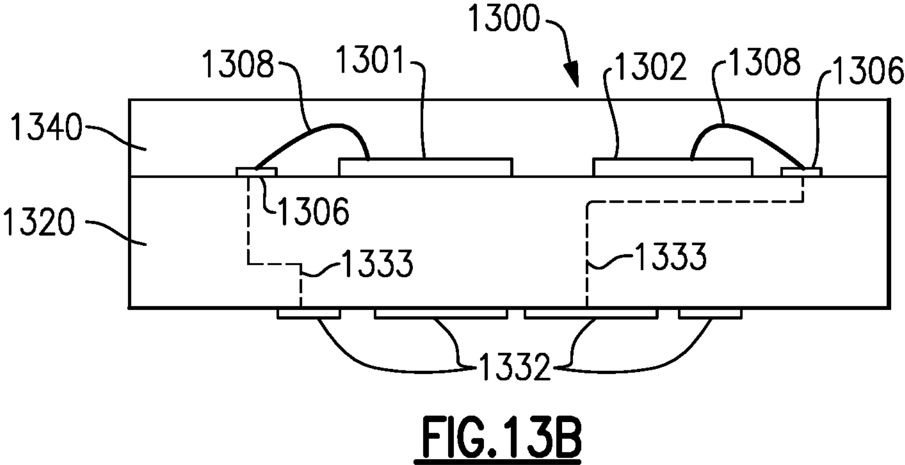
FIG. 13B is a schematic diagram of a cross-section of the packaged module of FIG. 13A taken along the lines 13B-13B.

FIG. 13A is a schematic diagram of one embodiment of a packaged module 1300. FIG. 13B is a schematic diagram of a cross-section of the packaged module 1300 of FIG. 13A taken along the lines 13B-13B.

In certain embodiments, for example, the packaged module 1300 can include some or all of the components of any the power amplifier systems 1040 of FIGS. 4A-4D (e.g., all of the components except the baseband processor 1001 and the transceiver 1002 of the system 1040 FIG. 4A), of the power amplifier switching circuit 500 of FIG. 5A, of the power amplifier switching circuit 500*b* of FIG. 10, or the front end 1203 of FIG. 12.

The packaged module 1300 includes a power amplifier die 1301, a supply switch die 1302, surface mount components 1303, wirebonds 1308, a package substrate 1320, and encapsulation structure 1340. The package substrate 1320 includes pads 1306 formed from conductors disposed therein. Additionally, the dies 1301, 1302 include pads 1304, and the wirebonds 1308 have been used to connect the pads 1304 of the dies 1301, 1302 to the pads 1306 of the package substrate 1320.

The power amplifier die 1301 and the supply switch die 1302 are implemented in accordance with one or more features of the present disclosure. In certain implementations, the supply switch die 1302 provides a selected power amplifier supply voltage to the power amplifier die 1301.

In certain implementations, the dies 1301, 1302 are manufactured using different processing technologies. In one example, the power amplifier die 1301 is manufactured using a heterojunction bipolar transistor (HBT) process, and the supply switch die 1302 is manufactured using a silicon process.

The package substrate 1320 can be configured to receive a plurality of components such as the dies 1301, 1302 and the surface mount components 1303, which can include, for example, surface mount capacitors and/or inductors.

As shown in FIG. 13B, the packaged module 1300 is shown to include a plurality of contact pads 1332 disposed on the side of the packaged module 1300 opposite the side used to mount the dies 1301, 1302. Configuring the packaged module 1300 in this manner can aid in connecting the packaged module 1300 to a circuit board such as a phone board of a wireless device. The example contact pads 1332 can be configured to provide RF signals, bias signals, power low voltage(s) and/or power high voltage(s) to the dies 1301, 1302 and/or the surface mount components 1303. As shown in FIG. 13B, the electrically connections between the contact pads 1332 and the die 1301 can be facilitated by connections 1333 through the package substrate 1320. The connections 1333 can represent electrical paths formed through the package substrate 1320, such as connections associated with vias and conductors of a multilayer laminated package substrate.

In some embodiments, the packaged module 1300 can also include one or more packaging structures to, for example, provide protection and/or facilitate handling of the packaged module 1300. Such a packaging structure can include overmold or encapsulation structure 1340 formed over the package substrate 1320 and the components and die(s) disposed thereon.

It will be understood that although the packaged module 1300 is described in the context of electrical connections based on wirebonds, one or more features of the present disclosure can also be implemented in other packaging configurations, including, for example, flip chip configurations.

Applications

Some of the embodiments described above have provided examples in connection with mobile devices. However, the principles and advantages of the embodiments can be used for any other systems or apparatus that have needs for UHB architectures. Examples of such RF communication systems include, but are not limited to, mobile phones, tablets, base stations, network access points, customer-premises equipment (CPE), laptops, and wearable electronics.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions, and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:

a power amplifier configured to output an amplified radio frequency signal;

a switch including a control input terminal, a radio frequency signal input terminal configured to receive the amplified radio frequency signal, and a radio frequency signal output terminal, the switch configured to switch on and off in response to a control signal provided on the control input terminal, and to pass the amplified radio frequency signal from the radio frequency signal input terminal to the radio frequency signal output terminal when the switch is switched on; and a switch control circuit including a control input configured to receive a switch control signal, a control output connected to the control input terminal of the switch, a forward biasing network including a first resistor and a first diode connected in series between the control input and the control output, and a reverse biasing network including a second resistor and a second diode connected in series between the control input and the control output.

2. The power amplifier system of claim 1 wherein an on-switching time of the switch depending on a resistance of the first resistor, and an off-switching time of the switch depending on a resistance of the second resistor.

3. The power amplifier system of claim 1 further comprising a network of one or more resistors between the radio frequency signal input terminal and the radio frequency signal output terminal of the switch.

4. The power amplifier system of claim 1 wherein the switch includes a field-effect transistor, and the control input terminal, radio frequency signal input terminal, and radio frequency signal output terminal correspond to a gate, source, and drain of the field-effect transistor, respectively.

5. The power amplifier system of claim 4 wherein the field-effect transistor is a metal-oxide semiconductor field-effect transistor (MOSFET) or a metal-semiconductor field-effect transistor (MESFET).

6. The power amplifier system of claim 1 wherein the forward biasing network or the reverse biasing network includes at least one additional circuit element configured in parallel with the first resistor or the second resistor.

7. The power amplifier system of claim 6 wherein the at least one additional circuit element is a capacitor configured to charge the forward biasing network or the reverse biasing network based upon a polarity of the switch control signal.

8. The power amplifier system of claim 1 wherein a resistance of the second resistor is higher than the resistance of the first resistor such that an on-switching time of the power amplifier system is lower than an off-switching time of the power amplifier system.

9. The power amplifier system of claim 8 wherein the resistance of the second resistor is at least 50% higher than the resistance of the first resistor.

10. The power amplifier system of claim 8 wherein the resistance of the second resistor is at least 75% higher than the resistance of the first resistor.

11. The power amplifier system of claim 8 wherein the resistance of the second resistor is at least double the resistance of the first resistor.

12. A radio frequency switching circuit comprising:

a switch including a control input terminal, a radio frequency signal input terminal configured to receive an amplified radio frequency signal, and a radio frequency signal output terminal, the switch configured to switch on and off in response to a control signal provided on the control input terminal, and to pass the amplified radio frequency signal from the radio frequency signal input terminal to the radio frequency signal output terminal when the switch is switched on; and a switch control circuit including a control input configured to receive a switch control signal, a control output connected to the control input terminal of the switch, a forward biasing network including a first resistor and a first diode connected in series between the control input and the control output, and a reverse biasing network including a second resistor and a second diode connected in series between the control input and the control output.

13. The radio frequency switching circuit of claim 12 wherein an on-switching time of the switch depending on a resistance of the first resistor, and an off-switching time of the switch depending on a resistance of the second resistor.

14. The radio frequency switching circuit of claim 12 further comprising a network of one or more resistors between the radio frequency signal input terminal and the radio frequency signal output terminal of the switch.

15. The radio frequency switching circuit of claim 12 wherein the switch includes a field-effect transistor, and the control input terminal, radio frequency signal input terminal, and radio frequency signal output terminal correspond to a gate, source, and drain of the field-effect transistor, respectively.

16. The radio frequency switching circuit of claim 15 wherein the field-effect transistor is a metal-oxide semiconductor field-effect transistor (MOSFET) or a metal-semiconductor field-effect transistor (MESFET).

17. The radio frequency switching circuit of claim 16 wherein the forward biasing network or the reverse biasing network includes at least one additional circuit element configured in parallel with the first resistor or the second resistor.

18. The radio frequency switching circuit of claim 17 wherein the at least one additional circuit element is a capacitor configured to charge the forward biasing network or the reverse biasing network based upon a polarity of the switch control signal.

19. The radio frequency switching circuit of claim 12 wherein a resistance of the second resistor is at least double a resistance of the first resistor.

20. A mobile device comprising:

a front end module including a power amplifier configured to output an amplified radio frequency signal, and a switch including a control input terminal, a radio frequency signal input terminal configured to receive the amplified radio frequency signal, and a radio frequency signal output terminal, the switch configured to switch on and off in response to a control signal provided on the control input terminal, and to pass the amplified radio frequency signal from the radio frequency signal input terminal to the radio frequency signal output terminal when the switch is switched on, the front end module further including a switch control circuit including a control input configured to receive a switch control signal, a control output connected to the control input terminal of the switch, a forward biasing network including a first resistor and a first diode connected in series between the control input and the control output, and a reverse biasing network including a second resistor and a second diode connected in series between the control input and the control output; and an antenna coupled to the front end module.

* * * * *